United States Patent
Wu et al.

(10) Patent No.: US 12,033,689 B2
(45) Date of Patent: Jul. 9, 2024

(54) AMPLIFICATION CONTROL METHOD AND CIRCUIT, SENSITIVE AMPLIFIER AND SEMICONDUCTOR MEMORY

(71) Applicant: CHANGXIN MEMORY TECHNOLOGIES, INC., Hefei (CN)

(72) Inventors: Daoxun Wu, Hefei (CN); Weibing Shang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 212 days.

(21) Appl. No.: 17/838,596

(22) Filed: Jun. 13, 2022

(65) Prior Publication Data

US 2023/0230631 A1    Jul. 20, 2023

Related U.S. Application Data

(63) Continuation of application No. PCT/CN2022/079701, filed on Mar. 8, 2022.

(30) Foreign Application Priority Data

Dec. 31, 2021  (CN) .......................... 202111658991.9

(51) Int. Cl.
*G11C 11/4091* (2006.01)

(52) U.S. Cl.
CPC ................ *G11C 11/4091* (2013.01)

(58) Field of Classification Search
CPC ................................................ G11C 11/4091
USPC ....................................................... 365/207
See application file for complete search history.

(56) References Cited

U.S. PATENT DOCUMENTS

| 5,396,465 | A | | 3/1995 | Oh |
| 5,506,524 | A | | 4/1996 | Lin |
| 6,141,270 | A | * | 10/2000 | Casper ............... G11C 7/06 365/201 |
| 6,147,925 | A | | 11/2000 | Tomishima |
| 6,614,702 | B2 | | 9/2003 | Lee |

(Continued)

FOREIGN PATENT DOCUMENTS

| CN | 101562042 A | 10/2009 |
| CN | 104078078 A | 10/2014 |

(Continued)

OTHER PUBLICATIONS

First Office Action of the Taiwanese application No. 111127066, issued on Aug. 28, 2023. 6 pages with English abstract.

(Continued)

*Primary Examiner* — Anthan Tran
(74) *Attorney, Agent, or Firm* — Kilpatrick Townsend & Stockton LLP

(57) ABSTRACT

An amplification control method and circuit, a sensitive amplifier and a semiconductor memory are provided. The method includes that: a preset instruction is received, and an isolation power value and a control instruction signal are determined according to the preset instruction; an isolation control signal is generated according to the isolation power value and the control instruction signal; and an amplification circuit receives the isolation control signal and a target signal to be processed according to the preset instruction, and processes the signal to be processed and completes the preset instruction.

20 Claims, 16 Drawing Sheets

(56) References Cited

U.S. PATENT DOCUMENTS

| | | |
|---|---|---|
| 7,102,947 B2 | 9/2006 | Kajitani |
| 2003/0043668 A1 | 3/2003 | Wickman |
| 2006/0023535 A1 | 2/2006 | Chun |
| 2008/0151664 A1 | 6/2008 | Kim |
| 2014/0077884 A1 | 3/2014 | Huynh |
| 2016/0197587 A1 | 7/2016 | Arknæs-Pedersen |
| 2019/0392873 A1 | 12/2019 | Kuroda |
| 2020/0027490 A1 | 1/2020 | Ingalls |
| 2020/0099353 A1 | 3/2020 | Danyuk et al. |
| 2020/0202907 A1* | 6/2020 | Yudanov ............... G06F 3/0604 |
| 2022/0028446 A1 | 1/2022 | Univ |

FOREIGN PATENT DOCUMENTS

| | | |
|---|---|---|
| CN | 105763162 A | 7/2016 |
| CN | 110729000 A | 1/2020 |
| CN | 111179983 A | 5/2020 |
| CN | 111863049 A | 10/2020 |
| CN | 111863051 A | 10/2020 |
| CN | 112712837 A | 4/2021 |
| CN | 112767975 A | 5/2021 |
| JP | H11273346 A | 10/1999 |
| TW | I222641 B | 10/2004 |

OTHER PUBLICATIONS

International Search Report in the international application No. PCT/CN2022/079726, mailed on Sep. 26, 2022. pages with English translation.

International Search Report in the international application No. PCT/CN2022/079712, mailed on Aug. 25, 2022. 5 pages with English translation.

International Search Report in the international application No. PCT/CN2022/079701, mailed on Oct. 8, 2022. 6 pages with English translation.

* cited by examiner

AMPLIFICATION CONTROL METHOD AND CIRCUIT, SENSITIVE AMPLIFIER AND SEMICONDUCTOR MEMORY

CROSS-REFERENCE TO RELATED APPLICATION

This is a continuation application of International Patent Application No. PCT/CN2022/079701, filed on Mar. 8, 2022, which is based upon and claims priority to Chinese patent application No. 202111658991.9, filed on Dec. 31, 2021 and entitled "AMPLIFICATION CONTROL METHOD AND CIRCUIT, SENSITIVE AMPLIFIER AND SEMICONDUCTOR MEMORY". The disclosures of International Patent Application No. PCT/CN2022/079701 and Chinese patent application No. 202111658991.9 are hereby incorporated by reference in their entireties.

BACKGROUND

A Dynamic Random Access Memory (DRAM) is a semiconductor storage device commonly used in computers, and consists of many repeated memory cells. In a data reading process, a read data signal of each memory cell is read out sequentially through a local data line, a global data line and a data bus; conversely, in a data writing process, a written data signal is written to the memory cell sequentially through the data bus, the global data line and the local data line.

At present, a sensitive amplifier exists between the memory cell and the local data line to improve the signal quality of memory cell contents. Stored data needs to be read or written after being amplified by the sensitive amplifier, but the performance of the sensitive amplifier needs to be improved due to the deficiencies of a data signal amplification process in the related art.

SUMMARY

The present disclosure relates to the technical field of semiconductor memory, and in particular to an amplification control method and circuit, a sensitive amplifier and a semiconductor memory, which can optimize a signal amplification process.

A technical solution of the present disclosure is implemented as follows.

In a first aspect of the present disclosure, there is provided an amplification control method, which is applied to an amplification circuit and includes the following operations.

A preset instruction is received, and an isolation power value and a control instruction signal are determined according to the preset instruction.

An isolation control signal is generated according to the isolation power value and the control instruction signal.

The amplification circuit receives the isolation control signal and a target signal to be processed according to the preset instruction, and processes the signal to be processed and completes the preset instruction.

In a second aspect of the present disclosure, there is provided an amplification control circuit, which includes: a signal determination circuit, an isolation control circuit and an amplification circuit.

The signal determination circuit is configured to determine, after receiving the preset instruction, the isolation power value and the control instruction signal according to the preset instruction.

The isolation control circuit is configured to receive the isolation power value and the control instruction signal, and generate the isolation control signal according to the control instruction signal.

The amplification circuit is configured to receive the isolation control signal and the target signal to be processed according to the preset instruction, and process the signal to be processed and complete the preset instruction.

In a third aspect of the present disclosure, there is provided a sensitive amplifier, which includes the amplification control circuit in the second aspect.

In a fourth aspect of the present disclosure, there is provided a semiconductor memory, which includes the sensitive amplifier in the third aspect.

DETAILED DESCRIPTION

The technical solutions in the embodiments of the present invention are clearly and completely described below in combination with the accompanying drawings in the embodiments of the present invention. It is understandable that the specific embodiments described here are used only to explain the present disclosure and not to limit it. It is to be noted that for ease of description, only those parts relevant to the present disclosure are illustrated in the accompanying drawings.

Unless otherwise defined, all technical and scientific terms in the specification have the same meaning as those skilled in the art, belonging to the present disclosure, usually understand. Terms used in the specification are only used for describing the purpose of the embodiments of the present disclosure, but not intended to limit the present disclosure.

"Some embodiments" involved in the following descriptions describes a subset of all possible embodiments. However, it can be understood that "some embodiments" may be the same subset or different subsets of all the possible embodiments, and may be combined without conflicts.

It should be pointed out that term "first/second/third" involved in the embodiments of the present disclosure is only for distinguishing similar objects and does not represent a specific sequence of the objects. Understandably, "first/second/third" may be interchanged to specific sequences or orders if allowed to implement the embodiments of the present disclosure described herein in sequences except the illustrated or described herein.

P-type Field Effect Transistor (FET): hole-type FET;
N-type FET: electron-type FET.

Figure 1:
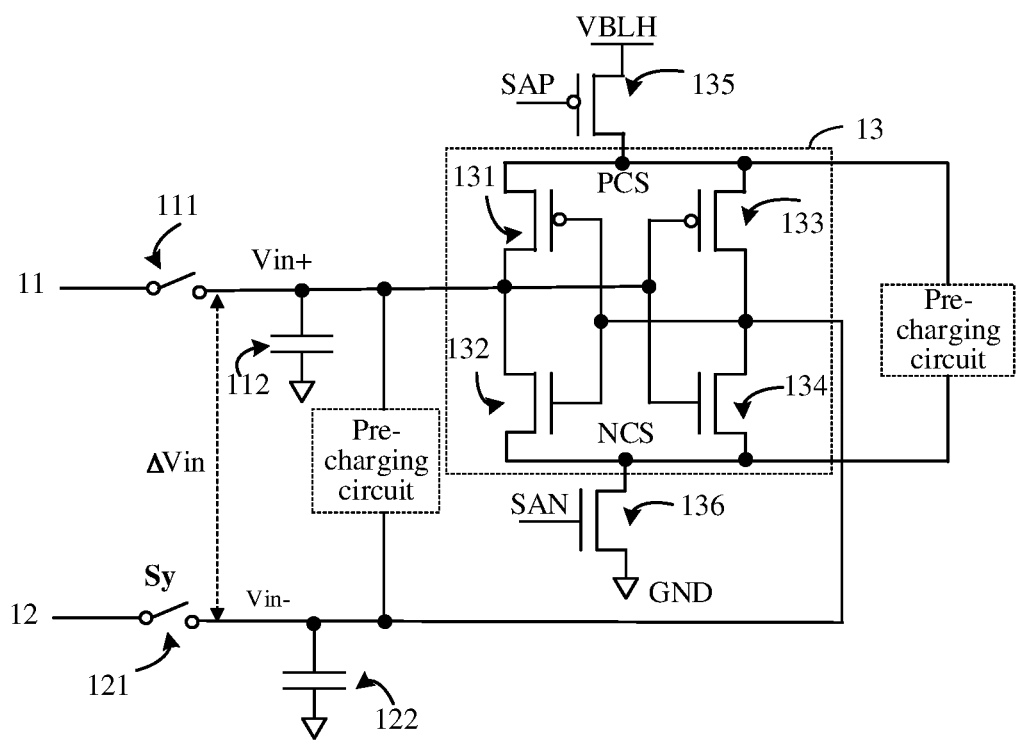
FIG. 1 is a schematic diagram of an application scenario of a sensitive amplifier.

Understandably, in the working process of a DRAM, a sensitive amplifier is needed to perform signal amplification in various operation processes. FIG. 1 illustrates a schematic diagram of an application scenario of a sensitive amplifier. As illustrated in FIG. 1, the application scenario includes a first signal line 11, a second signal line 12 and a sensitive amplifier 113.

A first switch 111 and a first capacitor 112 are arranged on the first signal line 11 for transmitting a signal Vin+ to be processed. A second switch 121 and a second capacitor 122 are arranged on the second signal line 12 for transmitting a reference signal Vin− to be processed. The sensitive amplifier 113 is configured to amplify the signal Vin+ to be processed and the reference signal Vin− to be processed. There is a voltage difference ΔVin between the signal Vin+ to be processed and the reference signal Vin− to be processed. Here, the first switch 111 and the first capacitor 112 may be regarded as a memory cell, and the second switch 121 and the second capacitor 122 may be regarded as another memory cell.

Specifically, the sensitive amplifier may include a first switch tube 131, a second switch tube 132, a third switch tube 133 and a fourth switch tube 134. The first terminal of the first switch tube 131, the first terminal of the second switch tube 132, the third terminal of the third switch tube 133 and the second terminal of the fourth switch tube 134 are all connected to the reference signal Vin− to be processed. The third terminal of the first switch tube 131, the second terminal of the second switch tube 132, the first terminal of the third switch tube 133 and the first terminal of the fourth switch tube 134 are all connected to the signal Vin+ to be processed. There are also a fifth switch tube 135 and a sixth switch tube 136 in the application scenario. The first terminal of the fifth switch tube 135 is connected to a first control signal SAP. The second terminal of the fifth switch tube 135 is connected to a power signal VBLH. The third terminal of the fifth switch tube 135, the second terminal of the first switch tube 131 and the second terminal of the third switch tube 133 are connected to form a first reference signal terminal. The first terminal of the sixth switch tube 136 is connected to a second control signal SAN. The second terminal of the sixth switch tube 136 is connected to a ground signal GND. The second terminal of the sixth switch tube 136, the third terminal of the second switch tube 132 and the third terminal of the fourth switch tube 134 are connected to form a second reference signal terminal. The first switch tube 131, the third switch tube 133 and the fifth switch tube 135 are the P-type FETs. The first terminal of the P-type FET is a gate electrode pin, the second terminal of the P-type FET is a source electrode pin, and the third terminal of the P-type FET is a drain electrode pin. The second switch tube 132, the fourth switch tube 134 and the sixth switch tube 136 are the N-type FETs. The first terminal of the N-type FET is the gate electrode pin, the second terminal of the N-type FET is the drain electrode pin, and the third terminal of the N-type FET is the source electrode pin.

In addition, there can also be a pre-charging circuit between the first signal line 11 and the second signal line 12, and there can also be a pre-charging circuit between the second terminal of the third switch tube 133 and the third terminal of the fourth switch tube 134 for pre-charging the first reference signal terminal and the second reference signal terminal.

At present, a signal amplification speed of the sensitive amplifier is low, and the circuit is prone to noise, which affects the performance of a semiconductor memory.

The embodiments of the present disclosure provide an amplification control circuit, which includes a power output circuit, an isolation control circuit, and an amplification circuit. The power output circuit is configured to receive a power switching signal and generate a preset power signal according to the power switching signal. The isolation control circuit is configured to receive a control instruction signal and the preset power signal, and generate an isolation control signal according to the control instruction signal. The amplification circuit is configured to receive the isolation control signal and the signal to be processed, and amplify the signal to be processed based on the isolation control signal to obtain a target amplification signal. In this way, the power switching signal can be used to control the preset power signal, and the specific voltage value of the power switching signal can be adjusted by changing the power switching signal, so as to adjust the specific voltage value of the isolation control signal, optimize a signal amplification process, and improve the problems of low signal amplification speed and being prone to noise.

The embodiments of the present disclosure provide an amplification control method, which includes the following operations. The preset instruction is received, and the isolation power value and the control instruction signal are determined according to the preset instruction. The isolation control signal is generated according to the isolation power value and the control instruction signal. The amplification circuit receives the isolation control signal and the target signal to be processed according to the preset instruction, and processes the signal to be processed to complete the preset instruction. In this way, by controlling the specific voltage value of the isolation control signal through the isolation power value, the signal amplification process can be optimized, and the problems of low signal amplification speed and large circuit noise can be at least partially improved.

The embodiments of the present disclosure are elaborated below in combination with the accompanying drawings.

Figure 2:
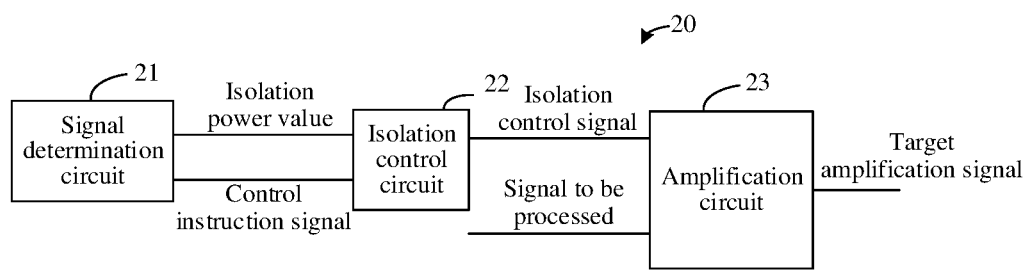
FIG. 2 is a schematic diagram of a composition structure of an amplification control circuit provided by an embodiment of the present disclosure.

In an embodiment of the present disclosure, FIG. 2 illustrates a composition structure diagram of an amplification control circuit 20 provided by the embodiment of the present disclosure. As illustrated in FIG. 2, the amplification control circuit 20 may include: a signal determination circuit 21, an isolation control circuit 22, and an amplification circuit 23.

The signal determination circuit 21 is configured to determine, after receiving the preset instruction, the isolation power value and the control instruction signal according to the preset instruction.

The isolation control circuit 22 is configured to receive the isolation power value and the control instruction signal, and generate the isolation control signal according to the control instruction signal.

The amplification circuit 23 is configured to receive the isolation control signal and the target signal to be processed according to the preset instruction, and process the signal to be processed to complete the preset instruction.

It is to be noted that the amplification control circuit 20 provided by the embodiment of the present disclosure may be applied in a variety of scenarios of signal amplification, such as the sensitive amplifier in the DRAM.

Here, the preset instruction may be a read instruction, a write instruction or a refresh instruction. Specifically, for the amplification circuit 20, the isolation power value and the control instruction signal are determined by means of the signal determination circuit 21 after the preset instruction is received; the isolation control signal is generated by means of the isolation control circuit 22 according to the control instruction signal, and the voltage value of the isolation control signal is affected by the isolation power value; the signal to be processed is amplified by means of the amplification circuit 23 according to the isolation control signal, so as to complete the preset instruction.

Figure 3:
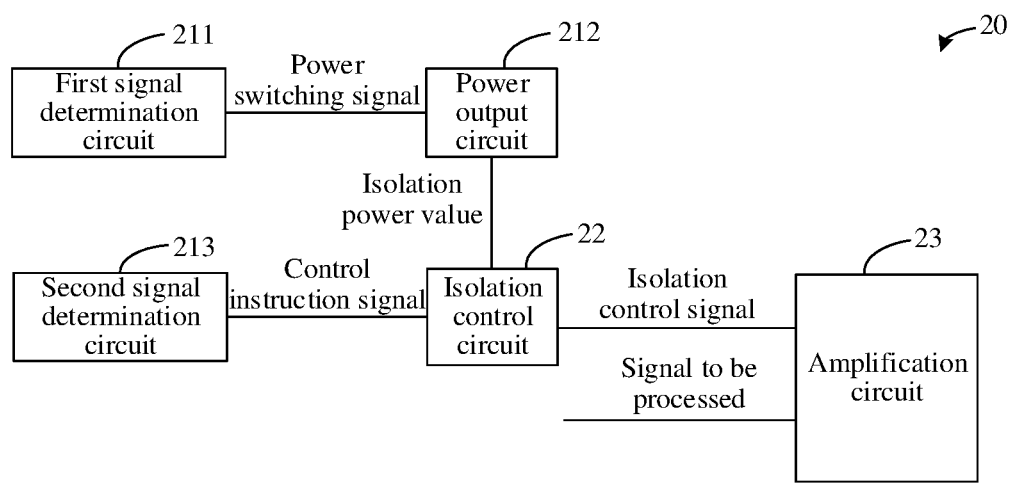
FIG. 3 is a schematic diagram of a composition structure of another amplification control circuit provided by an embodiment of the present disclosure.

In some embodiments, based on FIG. 2, as illustrated in FIG. 3, the isolation power value and the control instruction signal are determined by means of the signal determination circuit 21, and the isolation control signal is determined by means of the isolation control circuit 22. The signal determination circuit 21 may include a first signal determination circuit 211, a power output circuit 212 and a second signal determination circuit 213.

The first signal determination circuit 211 is configured to output, after receiving the preset instruction, a first power switching signal and/or a second power switching signal according to the preset instruction.

The power output circuit 212 is configured to output the isolation power value according to the first power switching signal and/or the second power switching signal.

The second signal determination circuit 213 is configured to generate the control instruction signal according to the preset instruction.

Here, the first power switching signal and/or the second power switching signal is represented by "power switching signal" in FIG. 3.

In a specific embodiment, the power output circuit 212 is configured to:

determine that the isolation power value has the first voltage value responsive to that the first power switching signal has the first level state and the second power switching signal has the second level state; or determine that the isolation power value has the second voltage value responsive to that the first power switching signal has the second level state and the second power switching signal has the first level state.

It is to be noted that, both the first voltage value and the second voltage value belong to the second level state, and the first voltage value is greater than the second voltage value. For the P-type FET, the first level state can make it in on-state, and the second level state can make it in off-state. For the N-type FET, the first level state can make it in the off-state, and the second level state can make it in the on-state. Here, because different switch tubes have different specifications, the first level state of different switch tubes may be different voltage ranges.

In this way, the power switching signal can be used to control the isolation power value, and the specific voltage value of the isolation power value can be adjusted by changing the power switching signal, so as to adjust the specific voltage value of the isolation control signal, optimize the signal amplification process, and partially improve the problems of low signal amplification speed and being prone to noise.

In some embodiments, the isolation control circuit 22 is specifically configured to: determine that the isolation control signal has the first voltage value responsive to that the control instruction signal has the second state and the isolation power value has the first voltage value; or determine that the isolation control signal has the second voltage value responsive to that the control instruction signal has the second state and the isolation power value has the second voltage value; or determine that the isolation control signal has the third voltage value responsive to that the control instruction signal has the first state.

It is to be noted that the first state is the first level state, and the second state is the second level state. Alternatively, the first state is the second level state, and the second state is the first level state.

In other words, for the isolation control circuit 22, if the control instruction signal is in the first level state, and the preset power signal has the first voltage value, the isolation control signal has the first voltage value; if the control instruction signal is in the first level state, and the preset power signal has the second voltage value, the isolation control signal has the second voltage value; if the control instruction signal is in the second level state, the isolation control signal has the third voltage value.

Alternatively, if the control instruction signal is in the second level state, and the preset power signal has the first voltage value, the isolation control signal has the first voltage value; if the control instruction signal is in the second level state, and the preset power signal has the second voltage value, the isolation control signal has the second voltage value; if the control instruction signal is in the first level state, the isolation control signal has the third voltage value.

Here, the third voltage value belongs to the first level state, both the first voltage value and the second voltage value belong to the second level state, and the third voltage value is less than the second voltage value, and the second voltage value is less than the first voltage value.

In this way, the isolation control signal has three different voltage values, which may provide more control methods of the amplification circuit to optimize the signal amplification process and partially improve the problems of low signal amplification speed and large circuit noise.

Taking that the power switching signals include both the first power switching signal and the second power switching signal as an example, a feasible structure of the power output circuit 212 is provided below.

Figure 4:
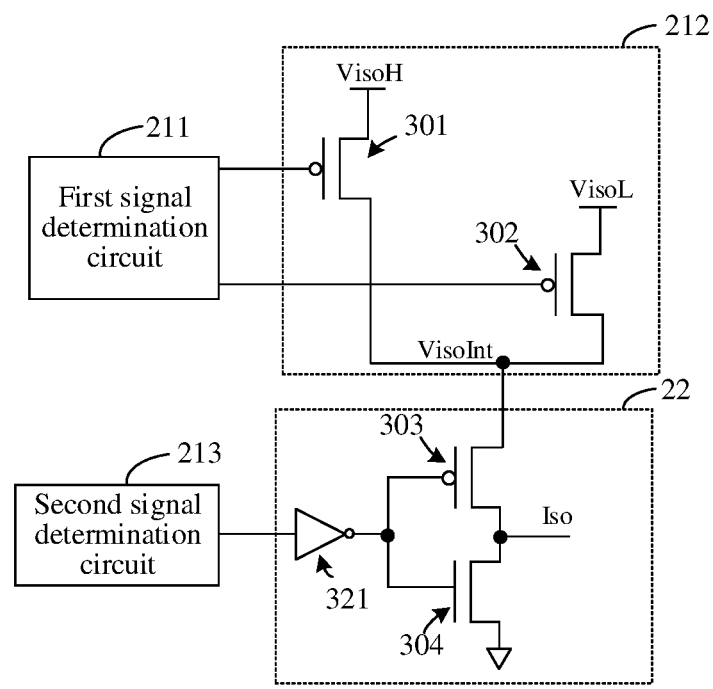
FIG. 4 is a schematic diagram of a local detailed structure of an amplification control circuit provided by an embodiment of the present disclosure.

Based on FIG. 3, as illustrated in FIG. 4, the power output circuit 212 may include a first preset power supply VisoH, a second preset power supply VisoL, a first switch tube 301, and a second switch tube 302.

The first terminal of the first switch tube 301 is connected to the first power switching signal, and the first terminal of the second switch tube 302 is connected to the second power switching signal.

The second terminal of the first switch tube 301 is connected to the first preset power supply VisoH, and the second terminal of the second switch tube 302 is connected to the second preset power supply VisoL.

The third terminal of the first switch tube 301 is connected to the third terminal of the second switch tube 302 to output the isolation power value VisoInt.

Here, the first preset power supply VisoH is configured to output the first voltage value, and the second preset power supply VisoL is configured to output the second voltage value.

It is to be noted that, as illustrated in FIG. 4, both the first switch tube 301 and the second switch tube 302 are the P-type FETs. In the following description, the first terminal of the P-type FET is the gate electrode pin, the second terminal of the P-type FET is the source electrode pin, and the third terminal of the P-type FET is the drain electrode pin.

It is to be noted that, when the first power switching signal is in the first level state and the second power switching signal is in the second level state, the first switch tube 301 is on and the second switch tube 302 is off, so the voltage values of the isolation power value VisoInt and the first preset power supply VisoH are the same, that is, the isolation power value VisoInt is the first voltage value. When the first power switching signal is in the second level state and the second power switching signal is in the first level state, the first switch tube 301 is off and the second switch tube 302 is on, so the voltage values of the isolation power value VisoInt and the second preset power supply VisoL are the same, that is, the isolation power value VisoInt is the second voltage value.

A feasible structure of the isolation control circuit is given below for the condition that the first state is the first level state and the second state is the second level state. In some embodiments, as illustrated in FIG. 4, the isolation control circuit 22 may include a first inverter 321, a third switch tube 303 and a fourth switch tube 304.

An input terminal of the first inverter 321 is connected to the control instruction signal, and an output terminal of the first inverter 321 is connected to the first terminal of the third switch tube 303 and the first terminal of the fourth switch tube 304 respectively.

The second terminal of the third switch tube 303 is connected to the isolation power value VisoInt, and the third terminal of the fourth switch tube 304 is connected to the ground signal.

The third terminal of the third switch tube 303 is connected to the second terminal of the fourth switch tube 304 to output the isolation control signal Iso.

It is to be noted that the third switch tube 303 is the P-type FET, and the fourth switch tube 304 is the N-type FET. In the following description, the first terminal of the N-type FET is the gate electrode pin, the second terminal of the N-type FET is the source electrode pin, and the third terminal of the N-type FET is the drain electrode pin.

In this way, when the control instruction signal is in the first level state, the third switch tube 303 is in the off-state, and the fourth switch tube 304 is in the on-state, thus the isolation control signal Iso has the third voltage value which is equivalent to a ground potential. When the control instruction signal is in the second level state, the third switch tube 303 is in the on-state, and the fourth switch tube 304 is in the off-state, thus the voltage value of the isolation control signal Iso is the same as the voltage value VisoInt of the isolation power value, that is, the first voltage value or the second voltage value.

In addition, for the condition that the first state is the second level state and the second state is the first level state, the isolation control circuit 22 may also include only the third switch tube 303 and the fourth switch tube 304, the output terminal of the signal control circuit 25 is connected to the first terminal of the third switch tube 303 and the first terminal of the fourth switch tube 304, other connections remain unchanged.

In this case, when the control instruction signal is in the second level state, the third switch tube 303 is in the off-state, and the fourth switch tube 304 is in the on-state, thus the isolation control signal Iso has the third voltage value which is equivalent to the ground potential. When the control instruction signal is in the first level state, the third switch tube 303 is in the on-state, and the fourth switch tube 304 is in the off-state, thus the voltage value of the isolation control signal Iso is the same as the voltage value VisoInt of the preset power signal, that is, the first voltage value or the second voltage value.

In this way, through the above processing, the isolation control circuit outputs the isolation control signal, so that the amplification circuit amplifies the signal to be processed according to the isolation control signal to obtain the target amplification signal.

It is to be noted that, taking the DRAM as an example, the amplification circuit 23 is connected to a target memory cell through a bit line and to a complementary memory cell through a complementary bit line. In the initial state, the potential of the bit line is the same as that of the complementary bit line. After the target memory cell (the object of the preset instruction) on the bit line is enabled, the memory cell shares the charge with the bit line, so the potential of the bit line increases or decreases; the memory cell on the complementary bit line is always disabled, so the potential of the complementary bit line remains constant. Because the potential of the bit line increases and decreases, the voltage difference between the bit line and the complementary bit line changes, so part of components in the amplification circuit 23 are turned on to perform signal amplification. In this case, the signal received by the amplification circuit 23 from the bit line may be regarded as the signal to be processed, and the signal received by the amplification circuit 23 from the complementary bit line may be regarded as the reference signal to be processed.

By setting the isolation control signal Iso as the first voltage value when the amplification circuit 23 is in an amplifying stage, a transmission speed of the signal to be processed between the target memory cell and the amplification circuit can be improved, and in the process that an internal node of the amplification circuit 23 can quickly reach a low reference potential or high reference potential, the bit line can also be quickly pulled up or the complementary bit line can also be quickly pulled down, so as to improve the signal amplification speed.

Subsequently, the amplification circuit 23 completes the signal amplification process. Details are given in the following content.

Figure 5:
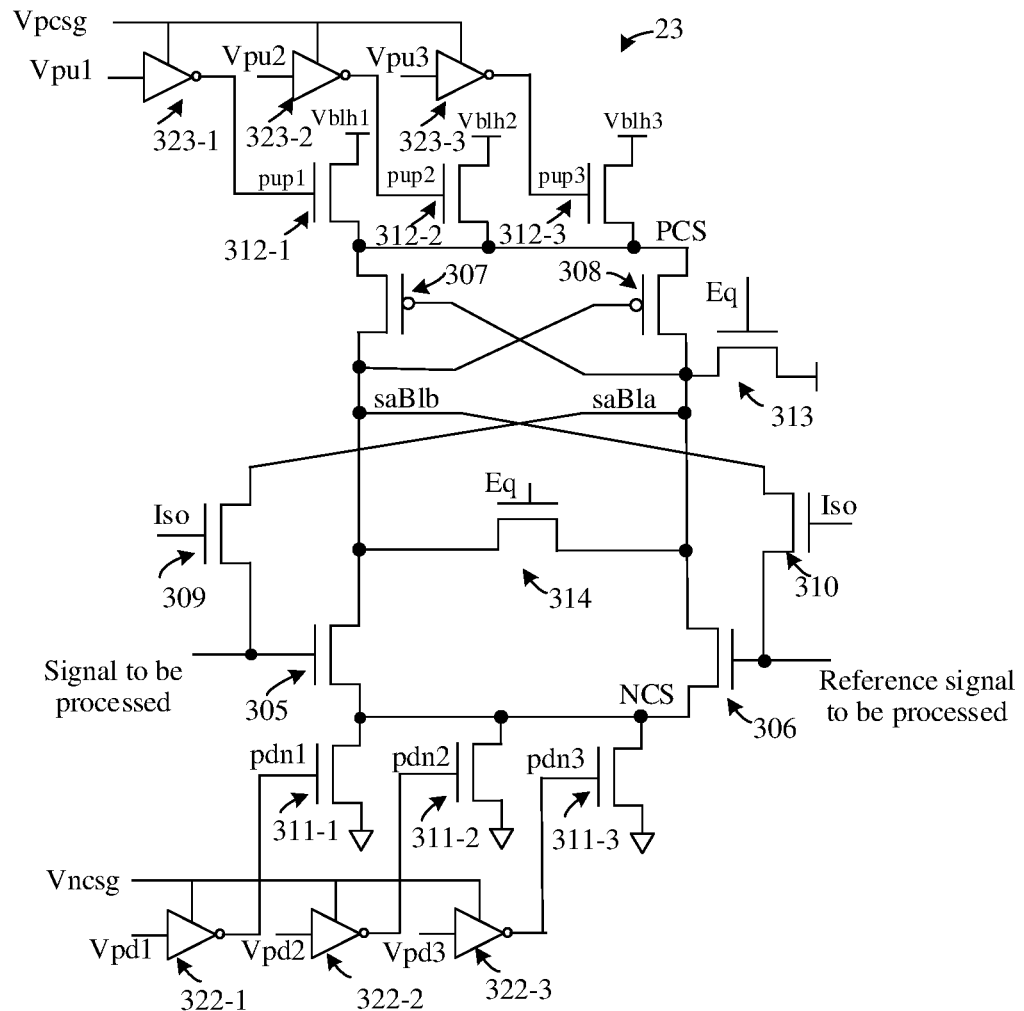
FIG. 5 is a schematic diagram of a local detailed structure of another amplification control circuit provided by an embodiment of the present disclosure.
Figure 8:
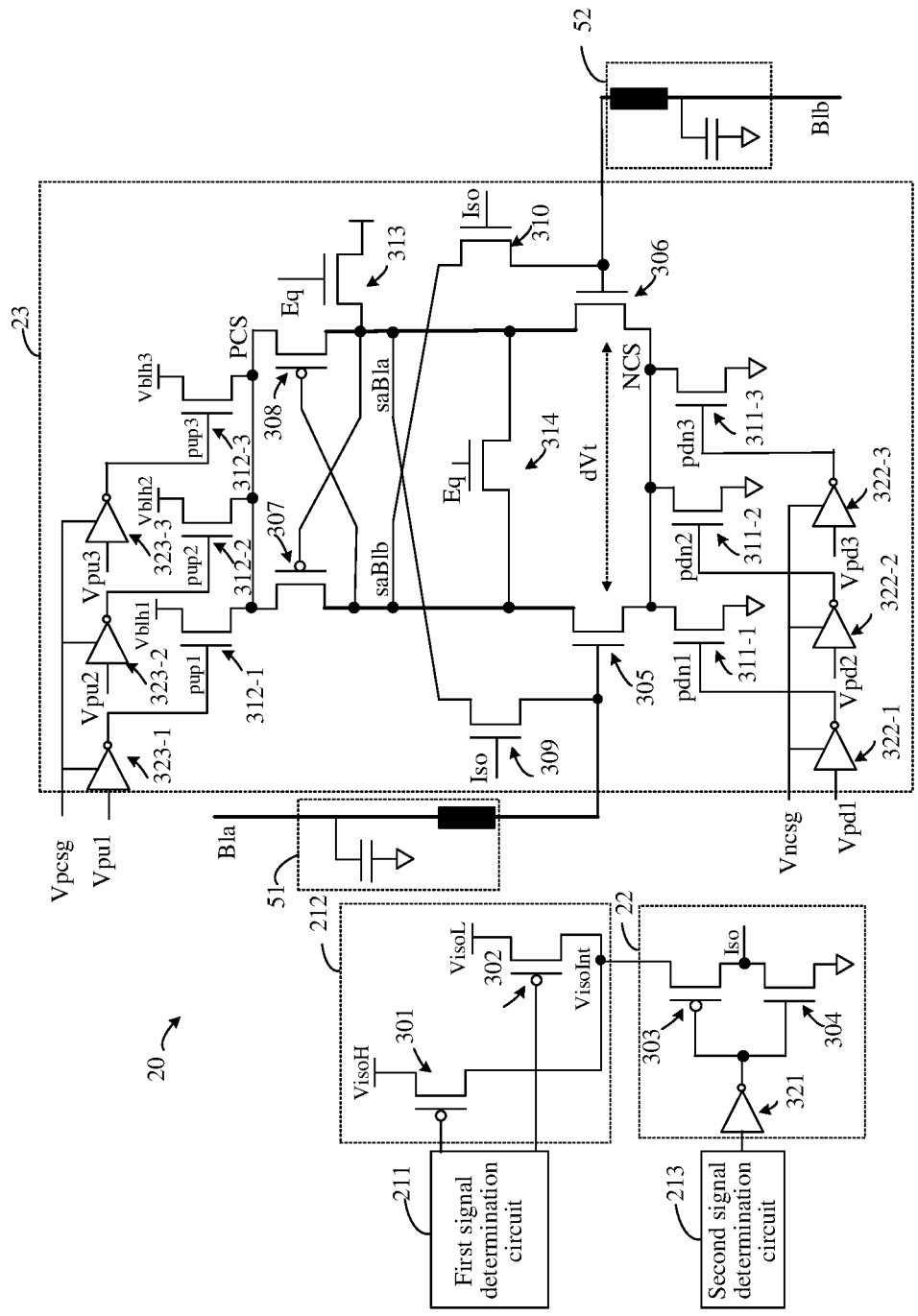
FIG. 8 is a schematic diagram of an application scenario of an amplification control circuit provided by an embodiment of the present disclosure.

In some embodiments, based on FIG. 3, as illustrated in FIG. 5 and FIG. 8, the amplification circuit 23 may include a control circuit and a cross-coupling circuit. The cross-coupling circuit may include a fifth switch tube 305, a sixth switch tube 306, a seventh switch tube 307 and an eighth switch tube 308. The control circuit may include a ninth switch tube 309 and a tenth switch tube 310.

The first terminal of the fifth switch tube 305 is connected to the third terminal of the ninth switch tube 309, and they are both connected to the bit line B1a for receiving the signal to be processed. The second terminal of the fifth switch tube 305, the third terminal of the seventh switch tube 307, the first terminal of the eighth switch tube 308 are connected to the second terminal of the tenth switch tube. The second terminal of the fifth switch tube 305, the third terminal of the seventh switch tube 307, the first terminal of the eighth switch tube 308 and the second terminal of the tenth switch tube 310 are all connected to the complementary readout bit line saB1b.

The first terminal of the sixth switch tube 306 is connected to the third terminal of the tenth switch tube 310, and they are both connected to the complementary bit line B1b for receiving the reference signal to be processed. The second terminal of the sixth switch tube 306, the third terminal of the eighth switch tube 308, the first terminal of the seventh switch tube are connected to the second terminal of the ninth switch tube. The second terminal of the sixth switch tube 306, the third terminal of the eighth switch tube 308, the first terminal of the seventh switch tube 307 and the second terminal of the ninth switch tube 309 are all connected to the readout bit line saB1a.

The third terminal of the fifth switch tube 305 and the third terminal of the sixth switch tube 306 are connected to the first reference signal NCS. The second terminal of the seventh switch tube 307 and the second terminal of the eighth switch tube 308 are connected to the second reference signal PCS. The first terminal of the ninth switch tube 309 and the first terminal of the tenth switch tube 310 are connected to the isolation control signal Iso.

As illustrated in FIG. 5, the fifth switch tube 305, the sixth switch tube 306, the ninth switch tube 309 and the tenth switch tube 310 are the N-type FETs, and the seventh switch tube 307 and the eighth switch tube 308 are the P-type FETs.

In this way, responsive to that the isolation control signal Iso is in the second level state (with the first voltage value or the second voltage value), the ninth switch tube 309 and the tenth switch tube 310 in the control circuit 232 are on, and the cross-coupling circuit 231 receives the signal to be processed; responsive to that the isolation control signal Iso is in the first level state (with the third voltage value), the ninth switch tube 309 and the tenth switch tube 310 in the control circuit 232 are off, and the cross-coupling circuit 231 cannot transmit the signal with the outside.

In some embodiments, as illustrated in FIG. 5, the amplification circuit 23 may also include a first reference circuit and a second reference circuit. The first reference circuit may include n eleventh switch tubes (such as the eleventh switch tubes 311-1, 311-2 and 311-3 in FIG. 5). The second reference circuit may include m twelfth switch tubes (such as the twelfth switch tubes 312-1, 312-2 and 312-3 in FIG. 5), where n and m are both positive integers.

The first terminal of the eleventh switch tube is connected to a first reference control signal, and the third terminal of the eleventh switch tube is connected to the ground signal. The second terminal of the eleventh switch tube is connected to the output terminal of the first reference circuit to output the first reference signal NCS.

The first terminal of the twelfth switch tube is connected to a second reference control signal, and the second terminal of the twelfth switch tube is connected to a third preset power supply. The second terminal of the twelfth switch tube is connected to the output terminal of the second reference circuit to output the second reference signal PCS.

It is to be noted that FIG. 5 illustrates three eleventh switch tubes, but there can be more or less eleventh switch tubes in practical application scenarios. In addition, there are also multiple first reference control signals pdn, and one first reference control signal pdn corresponds to one eleventh switch tube. The level states of multiple first reference control signals pdn may be different, that is, the level states of pdn1, pdn2 and pdn3 change separately. That is, one eleventh switch tube is separately controlled by one first reference control signal pdn.

As illustrated in FIG. 5, all the eleventh switch tubes may be the N-type FETs. Taking the eleventh switch tube 311-1 as an example, when the first reference control signal pdn1 is in the first level state, the eleventh switch tube 311-1 is off; and when the first reference control signal pdn1 is in the second level state, the eleventh switch tube 311-1 is on.

In this way, the potential of the first reference signal NCS is adjusted through the eleventh switch tube in the on-state, thus providing the low reference potential for the cross-coupling circuit. In addition, the different eleventh switch tubes are respectively connected to a separate ground potential, and the specific voltage values of these ground potentials may be different to provide different first reference signal NCS voltage drop rates. In addition, the first reference signal NCS voltage drop rate may also be controlled by controlling the number of the eleventh switch tubes in the on-state. In this way, the noise caused by the rapid voltage drop of the signal to be processed in the signal amplification process can be reduced by controlling a voltage adjustment speed to be different.

It is to be noted that FIG. 5 illustrates three twelfth switch tubes, but there can be more or less twelfth switch tubes in practical application scenarios. In addition, there are also multiple second reference control signals pup, and one second reference control signal pup corresponds to one twelfth switch tube. The level states of multiple second reference control signals pup may be different, that is, the level states of pup1, pup2 and pup3 change separately. That is, one twelfth switch tube is separately controlled by one second reference control signal pup.

As illustrated in FIG. 5, the twelfth switch tube may be the N-type FET.

Therefore, taking the twelfth switch tube 312-1 as an example, when the second reference control signal pup1 is in the first level state, the twelfth switch tube 312-1 is off; and when the first reference control signal pup1 is in the second level state, the eleventh switch tube 312-1 is on.

In this way, the twelfth switch tube in the on-state charges the second reference signal PCS to the second level state (the high reference potential), so as to provide the high reference potential for the cross-coupling circuit. Different twelfth switch tubes are respectively connected to a separate third preset power supply, and the voltage values of these third preset power supplies may be different to provide the second reference signal PCS with different voltage rise rates. In addition, the voltage rise rate may also be controlled by controlling the number of the twelfth switch tubes in the on-state. In this way, the noise caused by the rapid voltage rise of the second reference signal in the signal amplification process can be reduced by controlling the voltage rise rate to be different.

The first reference signal and the second reference signal are also connected with a fourth preset power supply, which can maintain the first reference signal NCS and the second reference signal PCS at the reference voltage value responsive to that the second reference control signal pup1 is in the first level state and the first reference control signal pdn1 is in the second level state.

In some embodiments, as illustrated in FIG. 5, the amplification circuit 23 may also include a first signal establishment circuit and a second signal establishment circuit. The first signal establishment circuit may include n second inverters (such as the second inverters 322-1, 322-2 and 322-3 in FIG. 5). The second signal establishment circuit may include m third inverters (such as the third inverters 323-1, 323-2 and 323-3 in FIG. 5).

The input terminal of the second inverter is connected to first control input signals (such as Vpd1, Vpd2 and Vpd3 in FIG. 5), and the output terminal of the second inverter is configured to output the first reference control signals (such as pdn1, pdn2 and pdn3 in FIG. 5). In the n second inverters, the first reference control signal of each eleventh switch tube is output through one second inverter.

The input terminal of the third inverter is connected to second control input signals (such as Vpu1, Vpu2 and Vpu3 in FIG. 5), and the output terminal of the third inverter is configured to output the second reference control signals (such as pup1, pup2 and pup3 in FIG. 5). In the m third inverters, the second reference control signal of each twelfth switch tube is output through one third inverter.

It is to be noted that as illustrated in FIG. 5, the input terminal of the second inverter is also connected to a power signal Vncsg. Responsive to that the first control input signal is in the first level state, the second inverter outputs the first reference control signal in the second level state according to the power signal Vncsg. Responsive to that the first control input signal is in the second level state, the second inverter outputs the first reference control signal in the first level state.

It is to be understood that there are multiple first control input signals, one second inverter is configured to receive one first control input signal, and the level states of these first control input signals may be different. Taking the first control input signal in FIG. 5 as an example, responsive to that the first control input signal Vpd1 is in the first level state, the second inverter 322-1 outputs the first reference control signal pdn1 in the second level state, and the eleventh switch tube 311-1 is in the on-state; on the contrary, responsive to that the first control input signal Vpd1 is in the second level state, the second inverter 322-1 outputs the first reference control signal pdn1 in the first level state, and the eleventh switch tube 311-1 is in the off-state.

It is to be noted that the input terminal of the third inverter is also connected to the power signal Vpcsg. Responsive to that the second control input signal is in the first level state, the third inverter outputs the second reference control signal in the second level state according to the power signal Vpcsg. Responsive to that the second control input signal is in the second level state, the third inverter outputs the second reference control signal in the first level state.

Similarly, there are multiple second control input signals, one third inverter is configured to receive one second control input signal, and the level states of these second control input signals may be different. Taking the second control input signal in FIG. 5 as an example, responsive to that the second control input signal Vpu1 is in the first level state, the third inverter 323-1 outputs the second reference control signal pup1 in the second level state, and the twelfth switch tube 312-1 is in the on-state; on the contrary, responsive to that the second control input signal Vpu1 is in the second level state, the third inverter 323-1 outputs the second reference control signal pup1 in the first level state, and the twelfth switch tube 312-1 is in the off-state.

Figure 6:
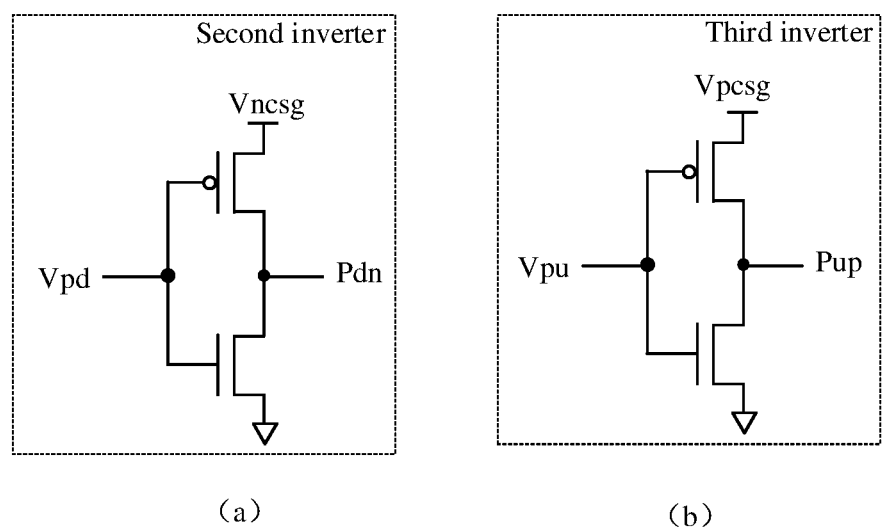
FIG. 6 is a structure diagram of an inverter provided by an embodiment of the present disclosure.

The second inverter and the third inverter may be of the same circuit structure, for example realized by an N-type FET and a P-type FET. FIG. 6 illustrates a structure diagram of an inverter provided by an embodiment of the present disclosure. The specific structure of the second inverter 322 is illustrated in (a) of FIG. 6, and the specific structure of the third inverter is illustrated in (b) of FIG. 6.

In this way, the first reference signal and the second reference signal can be provided to the amplification circuit by means of the signal establishment circuit and the reference circuit, so as to suppress the noise caused by voltage rise or voltage drop of the signal to be processed in the signal amplification process.

In some embodiments, as illustrated in FIG. 5, the amplification circuit 23 may also include a pre-charging circuit. The pre-charging circuit may include a thirteenth switch tube 313 and a fourteenth switch tube 314.

The first terminal of the thirteenth switch tube 313 and the first terminal of the fourteenth switch tube 314 are connected to a pre-charging signal Eq.

The second terminal of the thirteenth switch tube 313 is connected to the fourth preset power supply, and the third terminal of the thirteenth switch tube 313 is connected to the second terminal of the sixth switch tube 306.

The third terminal of the fourteenth switch tube 314 is connected to the second terminal of the fifth switch tube 305, and the second terminal of the fourteenth switch tube 314 is connected to the second terminal of the sixth switch tube 306.

Here, both the thirteenth switch tube 313 and the fourteenth switch tube 314 are the N-type FETs.

In this way, the pre-charging circuit performs, in response to the pre-charging signal Eq, pre-charging for the amplification circuit 23, so that each circuit node of the amplification circuit 23 has the same voltage value after pre-charging ends.

Figure 7:
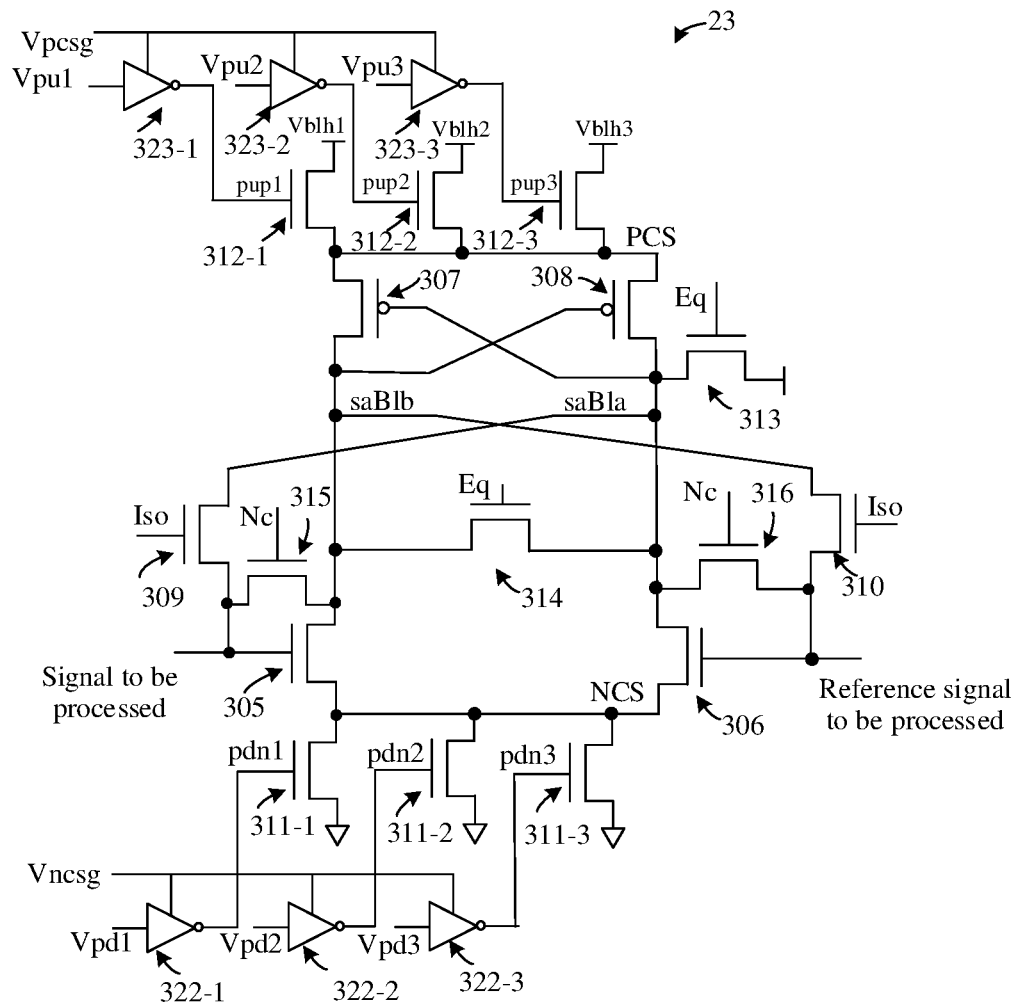
FIG. 7 is a schematic diagram of a local detailed structure of yet another amplification control circuit provided by an embodiment of the present disclosure.

In some embodiments, as illustrated in FIG. 7, the amplification circuit 23 may also include a noise cancelling circuit. The noise cancelling circuit may include a fifteenth switch tube 315 and a sixteenth switch tube 316.

The first terminal of the fifteenth switch tube 315 and the first terminal of the sixteenth switch tube 316 are connected to a noise cancelling signal Nc.

The second terminal of the fifteenth switch tube 315 is connected to the second terminal of the fifth switch tube 305, and the third terminal of the fifteenth switch tube 315 is connected to the first terminal of the fifth switch tube 305.

The second terminal of the sixteenth switch tube 316 is connected to the second terminal of the sixth switch tube 306, and the third terminal of the sixteenth switch tube 316 is connected to the first terminal of the sixth switch tube 306.

Here, both the fifteenth switch tube 315 and the sixteenth switch tube 316 are the N-type FET. Therefore, responsive to that the noise cancelling signal is in the second level state, the fifteenth switch tube 315 and the sixteenth switch tube 316 are on, so that the first terminal and the third terminal of the fifth switch tube 305 are shorted, and the first terminal and the third terminal of the sixth switch tube 306 are shorted; moreover, the first reference signal NCS is controlled at the low reference potential, and the second reference signal PCS is controlled at the high reference potential, so as to perform an offset cancellation operation to the fifth switch tube 305 and the sixth switch tube 306. In this way, a threshold difference of the switch tube in the signal amplification process may be further eliminated, and the accuracy of sensing the signal to be processed in the signal amplification process may be improved.

In particular, FIG. 4 to FIG. 7 are only optional circuit structures of the amplification control circuit. The first switch tube 301, the second switch tube 302, the third switch tube 303, the seventh switch tube 307 and the eighth switch tube 308 are the P-type FETs. The fourth switch tube 304, the fifth switch tube 305, the sixth switch tube 306, the ninth switch tube 309, the tenth switch tube 310, the eleventh switch tube 311, the twelfth switch tube 312, the thirteenth switch tube 313, the fourteenth switch tube 314, the fifteenth switch tube 315 and the sixteenth switch tube 316 are the N-type FETs. Of course, the selection of the above switch tubes does not form a limit to the embodiments of the present disclosure. In practical application scenarios, the aforementioned circuit control logic may be realized through various types of circuit components, and the components may be selected according to the actual application scenarios.

To sum up, in the embodiments of the present disclosure, by adding a power switching circuit, the preset power signal with two voltage values (the first voltage value or the second voltage value) is provided, and then the isolation control circuit may output the isolation control signal with three different voltage values (the first voltage value, the second voltage value or the third voltage value) according to the preset power signal. When the amplification circuit is in a non-operating state, the voltage of the preset power signal may be decreased to the second voltage value to reduce the leakage phenomenon of the switch tube in the isolation control circuit, thereby avoiding the failure of the switch tube and prolonging the service life of the isolation control circuit. In addition, the voltage value of the isolation control signal is adjusted to the first voltage value or the second voltage value in different working stages of the amplification circuit, so as to improve the voltage change speed of the signal to be processed, optimize the signal amplification process, and improve the problems of low signal amplification speed and large circuit noise.

In another embodiment of the present disclosure, FIG. 8 illustrates a schematic diagram of an application scenario of an amplification control circuit provided by an embodiment of the present disclosure. As illustrated in FIG. 8, there are the bit line B1a, the complementary bit line B1b, the readout bit line saB1a, the complementary readout bit line saB1b and the amplification control circuit 20 in the application scenario. The first memory cell 51 is arranged on the bit line B1a, and the second memory cell 52 is arranged on the complementary bit line B1b. Here, both the first memory cell 51 and the second memory cell 52 may act as the object of the preset instruction respectively.

The amplification control circuit 20 may include the first signal determination circuit 211, the power output circuit 212, the second signal determination circuit 213, the isolation control circuit 22 and the amplification circuit 23. Here, the power output circuit 212 may include the first switch tube 301 and the second switch tube 302, and the isolation control circuit 22 may include the third switch tube 303, the fourth switch tube 304 and the first inverter 321. The amplification circuit 23 may include the fifth switch tube 305, the sixth switch tube 306, the seventh switch tube 307, the eighth switch tube 308, the ninth switch tube 309, the tenth switch tube 310, three eleventh switch tubes (the eleventh switch tubes 311-1, 311-2 and 311-3 in FIG. 8), three twelfth switch tubes (the twelfth switch tubes 312-1, 312-2 and 312-3 in FIG. 8), the thirteenth switch tube 313, the fourteenth switch tube 314, the fifteenth switch tube 315, three second inverters (the second inverters 322-1, 322-2 and 322-3 in FIG. 8) and three third inverters (the third inverters 323-1, 323-2 and 323-3 in FIG. 8). The connection relation and type of each component are illustrated in FIG. 8, and the working principle of its circuit may refer to the foregoing content, so elaborations are omitted herein.

Figure 10:
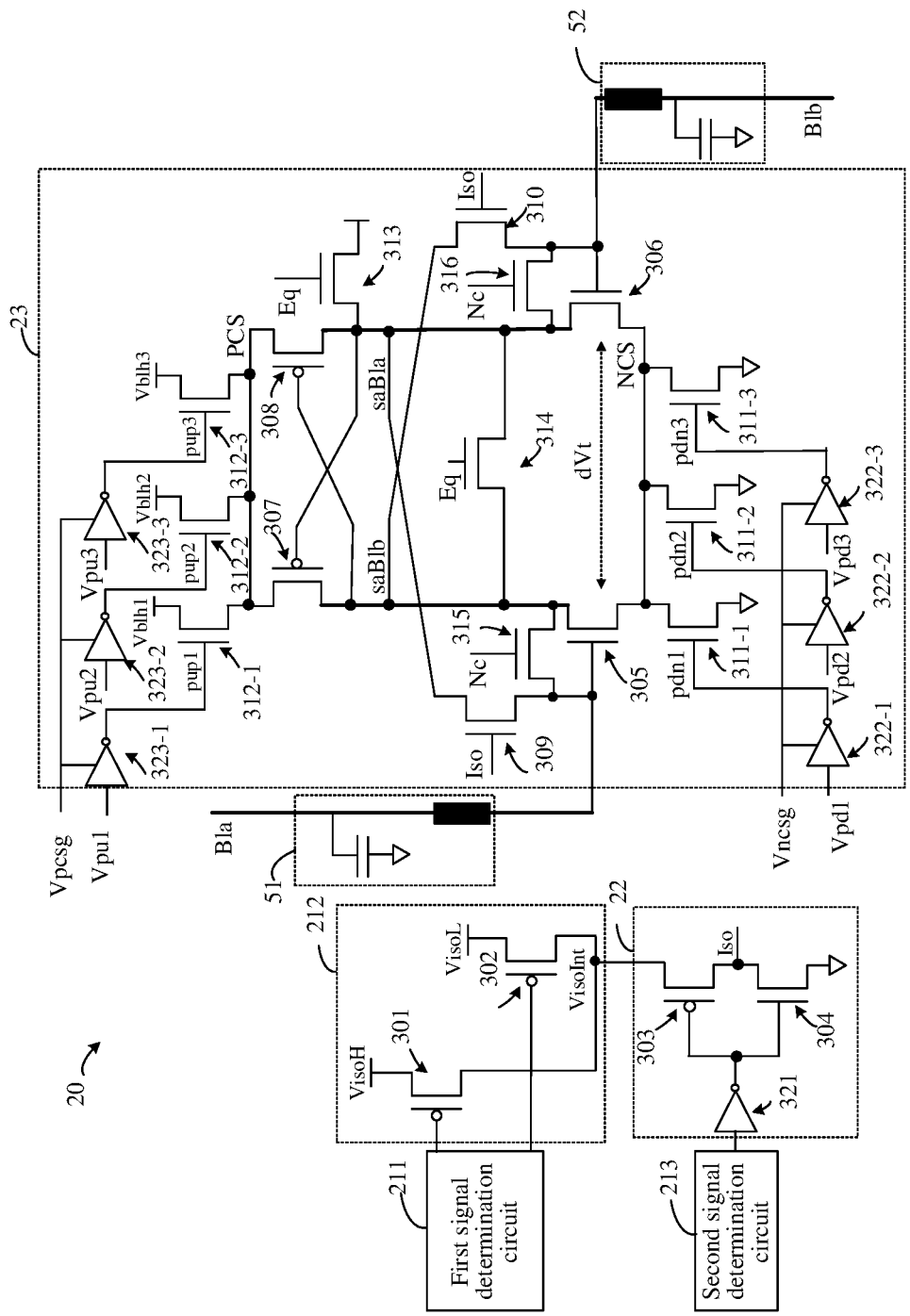
FIG. 10 is a schematic diagram of an application scenario of another amplification control circuit provided by an embodiment of the present disclosure.

Based on FIG. 8, FIG. 10 illustrates a schematic diagram of an application scenario of another amplification control circuit provided by an embodiment of the present disclosure. As illustrated in FIG. 10, the amplification circuit may also include the fifteenth switch tube 315 and the sixteenth switch tube 316. The second terminal of the fifteenth switch tube 315 is connected to the complementary readout bit line saB1b, the third terminal of the fifteenth switch tube 315 is connected to the bit line B1a, the second terminal of the sixteenth switch tube 316 is connected to the readout bit line saB1a, and the third terminal of the sixteenth switch tube 316 is connected to the complementary bit line B1b. In response to the noise cancelling signal Nc, the offset cancellation operation is performed to the ninth switch tube 309 and the tenth switch tube 310 by controlling the first reference signal NCS at the low reference potential, and the second reference signal PCS at the high reference potential.

Based on the above circuit structure, the control method of the amplification circuit 23 is briefly described.

Figure 9:
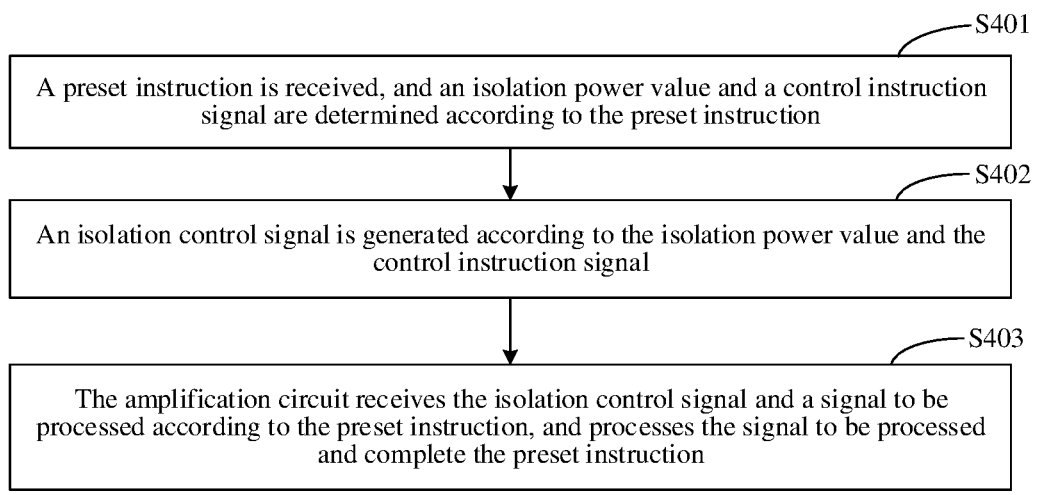
FIG. 9 is a schematic flowchart of an amplification control method provided by an embodiment of the disclosure.

FIG. 9 is a flowchart of an amplification control method provided by an embodiment of the disclosure. As illustrated in FIG. 9, the amplification control method may include the following operations.

At S401, the preset instruction is received, and the isolation power value and the control instruction signal are determined according to the preset instruction.

Specifically, in some embodiments, that the isolation power value is determined according to the preset instruction may include the following operations.

The first power switching signal and/or the second power switching signal is obtained according to the preset instruction.

The isolation power value is determined according to the first power switching signal and/or the second power switching signal.

It is to be noted that the isolation power value may be determined according to one or two signals, depending on the actual application scenarios.

It is to be noted that the preset instruction at least includes one of a read instruction, a refresh instruction and a write instruction. The isolation power value is the second voltage value or the third voltage value. The isolation control signal is one of the first voltage value, the second voltage value and the third voltage value. The first voltage value is greater than the second voltage value, and the second voltage value is greater than the third voltage value. Both the first voltage value and the second voltage value belong to the second level state, and the third voltage value belongs to the first level state.

In some embodiments, the operation that the isolation power value is determined according to the first power switching signal and/or the second power switching signal may include the following operation.

It is determined that the isolation power value has the first voltage value responsive to that the first power switching signal has a first level state and the second power switching signal has a second level state.

Alternatively, it is determined that the isolation power value has the second voltage value responsive to that the first power switching signal has the second level state and the second power switching signal has the first level state.

In this way, the isolation power value and the control instruction signal are determined after the preset instruction is received, and the isolation power value may be adjusted flexibly. Various control strategies are provided later to improve the problems of low signal amplification speed and large circuit noise.

At S402, the isolation control signal is generated according to the isolation power value and the control instruction signal.

It is to be noted that the isolation power value and the control instruction signal may determine the voltage value of the isolation control signal.

In some embodiments, that the isolation control signal is generated according to the isolation power value and the control instruction signal may include the following operation.

It is determined that the isolation control signal has the first voltage value responsive to that the control instruction signal has the second state and the isolation power value has the first voltage value.

Alternatively, it is determined that the isolation control signal has the second voltage value responsive to that the control instruction signal has the second state and the isolation power value has the second voltage value.

Alternatively, it is determined that the isolation control signal has the third voltage value responsive to that the control instruction signal has the first state.

Here, the first state is the first level state, and the second state is the second level state; or the first state is the second level state, and the second state is the first level state.

In this way, the isolation control signal has three different voltage values, which may provide more control means to optimize the signal amplification process and improve the problems of low signal amplification speed and large circuit noise.

At S403, the amplification circuit receives the isolation control signal and the signal to be processed according to the preset instruction, and processes the signal to be processed to complete the preset instruction.

In this way, the isolation control signal and the signal to be processed are determined after the preset instruction is received, so that the amplification circuit may process the signal to be processed according to the isolation control signal to complete the preset instruction. In addition, because the isolation control signal has three different voltage values, more control means may be provided to optimize the signal amplification process and partially improve the problems of low signal amplification speed and large circuit noise.

Specifically, in some embodiments, the working stages of the amplification circuit 23 illustrated in FIG. 8 include: a standby stage, a first charge sharing stage, a second charge sharing stage, a first amplifying stage, a second amplifying stage and a pre-charging stage. The method may also include the following operations.

When the amplification circuit is in the standby stage, each node voltage in the amplification circuit is maintained at the preset potential.

When the amplification circuit is in the first charge sharing stage, the target memory cell forms the signal to be processed according to the preset instruction.

When the amplification circuit is in the second charge sharing stage, the signal to be processed is transmitted to the amplification circuit in response to the isolation control signal.

When the amplification circuit is in the first amplifying stage, the amplification circuit amplifies the signal to be processed.

When the amplification circuit is in the second amplifying stage, data of the target memory cell is restored through the amplified signal to be processed.

When the amplification circuit is in the pre-charging stage, the amplification circuit completes the preset instruction to the target memory cell and restores each node voltage in the amplification circuit to the preset potential.

It is to be noted that as illustrated in FIG. 8, in the standby stage, the bit line B1a/the complementary bit line B1b, the readout bit line saB1a/the complementary readout bit line saB1b, and the first reference signal NCS/the second reference signal PCS are maintained at the preset potential through the fourth preset power supply for subsequent operation according to the preset instruction received. In this case, the isolation control signal Iso needs to be in the second level state, and the ninth switch tube 309 and the tenth switch tube 310 are in the on-state.

It is assumed that the target memory cell of the preset instruction is the first memory cell 51. After the preset instruction is received, the amplification circuit 23 enters the first charge sharing stage, the first memory cell 51 is enabled to be connected to the bit line B1a, so that the first memory cell 51 shares the charge with the bit line B1a. In this case, the isolation control signal Iso needs to be in the first level state, and the ninth switch tube 309 and the tenth switch tube 310 are in the off-state, so that the bit line B1a is not connected to the readout bit line saB1a, and the complementary bit line B1b is not connected to the complementary readout bit line saB1b too, so as to avoid affecting the charge sharing between the first memory cell 51 and the bit line B1a.

After the first charge sharing stage ends, the bit line B1a needs to be connected to the readout bit line saB1a, and the complementary bit line B1b needs to be connected to the complementary readout bit line saB1b, so that the amplification circuit 23 enters the second charge sharing stage. In this case, the bit line B1a shares the charge with the readout line saB1a, and the complementary bit line B1b shares the charge with the complementary readout bit line saB1b. In this case, the isolation control signal Iso needs to be in the second level state, and the ninth switch tube 309 and the tenth switch tube 310 are in the on-state, so as to turn on the bit line B1a and the readout bit line saB1a, and turn on the complementary bit line B1b and the complementary readout bit line saB1b.

After the second charge sharing stage ends, the amplification circuit 23 enters the first amplifying stage, and the potential of the readout bit line saB1a and the complementary readout bit line saB1b is amplified by means of the amplification circuit 23.

After the first amplifying stage ends, the amplification circuit 23 enters the second amplifying stage, in which the amplified potential on the readout bit line B1a needs to be used to rewrite data to the first memory cell 51 through the connection between the bit line B1a and the first memory cell 51, so as to restore the data of the first memory cell 51. It is to be understood that, in this case, the amplified potential on the complementary readout bit line saB1b will also be transferred to the complementary bit line B1b, but will not be written to the memory cell because the memory cell on the complementary bit line B1b is not enabled.

After the second amplifying stage ends, it is needed to disable the first memory cell 51, and disconnect the connection between the target memory cell and the bit line B1a;

at this point, the preset instruction may be considered completed. Then, the amplification circuit enters the pre-charging stage, and the bit line B1a, the complementary bit line B1b, the readout bit line saB1a and the complementary readout bit line saB1b are restored to the preset potential.

In addition, for the first amplifying stage, the second amplifying stage and the pre-charging stage, the isolation control signal is maintained in the second level state, and the ninth switch tube 309 and the tenth switch tube 310 are in the on-state, thus keeping the bit line B1a and the readout bit line saB1a connected, and keeping the complementary bit line B1b and the complementary readout bit line saB1b connected.

After the pre-charging stage ends, the amplification circuit enters the standby stage again to prepare for the next operation.

In this way, through the above stages, the amplification circuit 23 amplifies the signal to be processed to complete the preset instruction.

Based on this, as illustrated in FIG. 8 and FIG. 10, the isolation power value VisoInt output by the power output circuit 212 may have the first voltage value or the second voltage value, so the isolation control signal Iso output by the isolation control circuit 22 may have the first voltage value, the second voltage value and the third voltage value. In other words, based on that the isolation control signal Iso is in the second level state, the isolation control signal Iso may further be controlled at the first voltage value or the second voltage value.

For the application scenario in FIG. 10, the change rules of the isolation control signal in different working stages of the amplification circuit are described in detail below.

In some embodiments, that the amplification circuit processes the signal to be processed may include the following operations.

When the amplification circuit is in one stage of the signal amplifying stage, the isolation control signal is controlled to have the first voltage value.

When the preset instruction is the read instruction or the refresh instruction, the signal amplifying stage may include a first amplifying stage and a second amplifying stage.

When the preset instruction is the write instruction, the signal amplifying stage may include a first amplifying stage, a signal writing-in stage and a second amplifying stage.

In this way, in a stage of the signal amplifying stage, the change speed of the signal to be processed may be improved by controlling the isolation control signal to have the first voltage value; at the same time, in other stages of the signal amplifying stage, the power consumption may be reduced and the service life of the circuit may be prolonged by controlling the isolation control signal to have the second voltage value. In this way, the signal amplification process is optimized.

The read instruction, the refresh instruction and the write instruction are respectively described in detail below.

In a specific embodiment, the preset instruction is the read instruction. The process that the amplification circuit processes the signal to be processed may include: the standby stage, the noise cancelling stage, the first charge sharing stage, the second charge sharing stage, the first amplifying stage, the second amplifying stage and the pre-charging stage. The method may also include the following operation.

If the amplification circuit is in the noise cancelling stage or the first charge sharing stage, the isolation control signal is maintained with the third voltage value. Alternatively, if the amplification circuit is in the standby stage or the second charge sharing stage or the first amplifying stage, the iso- lation control signal is maintained with the second voltage value. Alternatively, if the amplification circuit is in the pre-charging stage or the second amplifying stage, the isolation control signal is maintained with the first voltage value.

Figure 11:
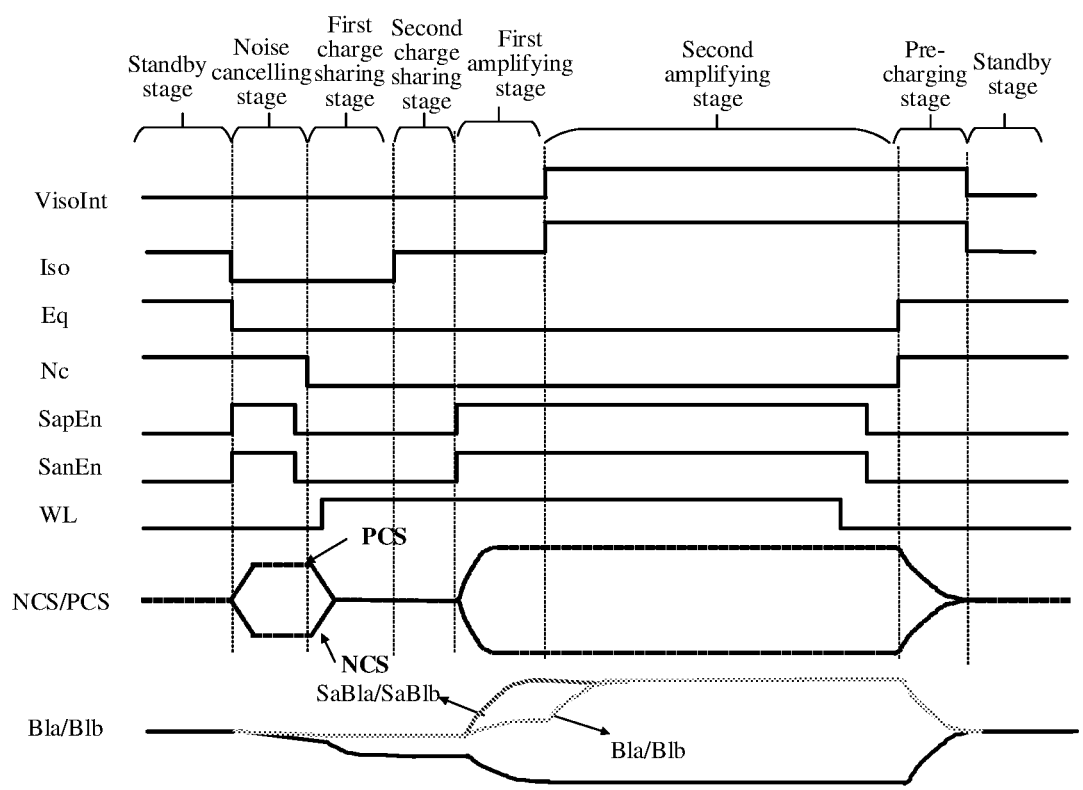
FIG. 11 is a first schematic diagram of a signal timing sequence provided by an embodiment of the present disclosure.

It is to be noted that FIG. 11 illustrates a schematic diagram of a signal timing sequence of a read operation provided by an embodiment of the present disclosure. In FIG. 11, VisoInt refers to the aforementioned preset power signal, which may be the first voltage value or the second voltage value; Iso refers to the aforementioned isolation control signal, which may be the first voltage value, the second voltage value and the third voltage value; Eq refers to the aforementioned pre-charging signal, and Nc refers to the aforementioned noise cancelling signal; SanEn refers to the aforementioned first reference control signal, and SapEn refers to the aforementioned second reference control signal; WL refers to a word line enabling signal; responsive to that the WL is in the second level state, the word line where the target memory cell is located is enabled, so that the target memory cell is connected to the bit line; and responsive to that the WL is in the first level state, the word line where the target memory cell is located is disabled, so that the target memory cell is not connected to the bit line; NCS/PCS refers to the first reference signal/the second reference signal; the first reference signal has the fourth voltage value and the fifth voltage value, and the second reference signal has the fourth voltage value and the sixth voltage value; the fourth voltage value refers to the aforementioned preset potential and is between the fifth voltage value and the sixth voltage value; B1a refers to the bit line, B1b refers to the complementary bit line, saB1a refers to the readout bit line, and saB1b refers to the complementary readout bit line.

As illustrated in FIG. 11, responsive to that the amplification circuit is in the standby stage, the preset power signal VisoInt is maintained at the second voltage value, the isolation control signal Iso is maintained at the second voltage value, the pre-charge signal Eq and the noise cancelling signal Nc are in the second level state, the first reference control signal SanEn/the second reference control signal SapEn is in the first level state, the word line enabling signal WL is in the first level state, the first reference signal NCS/the second reference signal PCS is maintained at the fourth voltage value, and the bit line B1a/the complementary bit line B1b and the readout bit line saB1a/the complementary readout bit line saB1b are at the fourth voltage value. In this case, each circuit node of the amplification circuit 23 is at the same voltage value, which makes a preparation for the execution of user's operation instructions.

Assuming that the target memory cell is the first memory cell 51, after the user sends the read instruction for the target memory cell, the amplification circuit 23 enters from the standby stage to the noise cancelling stage; at this point, the isolation control signal Iso is adjusted from the second voltage value to the third voltage value, the pre-charging signal Eq is adjusted from the second level state to the first level state, and the first reference control signal SanEn/the second reference control signal SapEn is adjusted from the first level state to the second level state, so the first reference signal NCS changes from the fourth voltage value to the fifth voltage value, and the second reference signal PCS changes from the fourth voltage value to the sixth voltage value, while the noise cancelling signal Nc still remains in the second level state, so as to perform noise cancellation to the amplification circuit 23. After that, the first reference control signal SanEn/the second reference control signal SapEn is switched to the first level state, and the first reference signal NCS and the second reference signal PCS continue to be powered by a pre-charging power supply to be restored to the fourth voltage value.

After the noise cancelling stage ends, the word line enabling signal WL changes to the second level state, and the word line where the target memory cell is located is adjusted to an enabled state, so that the amplification circuit 23 enters the first charge sharing stage, and the target memory cell (e.g. the first memory cell 51) is read. As illustrated in FIG. 11, taking that the data stored in the first memory cell 51 is "0" as an example, after the first charge sharing stage ends, the voltage of the bit line B1a drops, that is, the signal to be processed is generated, and the complementary bit line B1b forms the reference signal to be processed. In addition, in the first charge sharing stage, the preset power signal is maintained at the second voltage value, the isolation control signal Iso is maintained at the third voltage value, so that the bit line B1a is not connected to the readout bit line saB1a, and the complementary bit line B1b is not connected to the complementary readout bit line saB1b. The pre-charging signal Eq, the noise cancelling signal Nc, the first reference control signal SanEn/the second reference control signal SapEn are all in the first level state.

After the first charge sharing stage ends, the amplification circuit 23 enters the second charge sharing stage. In the second charge sharing stage, the isolation control signal Iso is maintained at the second voltage value, so that the bit line B1a is connected to the readout bit line saB1a, and the complementary bit line B1b is connected to the complementary readout bit line saB1b, and then the amplification circuit 23 receives the signal to be processed and the reference signal to be processed to the internal node, and reduces the voltage of the readout bit line saB1a, which may be regarded as the bit line B1a/the complementary bit line B1b and the readout bit line saB1a/the complementary readout bit line saB1b share the charge. In addition, all other signals except the isolation control signal Iso maintain the voltage value of the previous stage.

After the second charge sharing stage ends, the amplification circuit 23 enters the first amplifying stage, and the first reference control signal SanEn/the second reference control signal SapEn is adjusted from the first level state to the second level state, so that the first reference signal NCS changes to the fifth voltage value, the second reference signal PCS changes from the fourth voltage value to the sixth voltage value, the voltage of the readout bit line saB1a drops to turn on the ninth switch tube 309, the second reference signal PCS increase the voltage of the complementary readout bit line saB1b to turn on the sixth switch tube 306, and the first reference signal NCS decreases the voltage of the readout bit line saB1a. In this way, the amplification circuit 23 can amplify the signal to be processed (the signal of the bit line B1a)/the reference signal to be processed (the signal of the complementary bit line B1b) according to the first reference signal NCS/the second reference signal PCS, and the isolation control signal Iso is still maintained at the second voltage value, so as to complete the signal amplification of the signal to be processed (the signal of the bit line B1a)/the reference signal to be processed (the signal of the complementary bit line B1b).

In addition, if the data stored in the first memory cell 51 is "1", the voltage of the bit line B1a in the first amplifying stage will be increased, which can suppress the rise rate on the bit line B1a/the complementary bit line B1b and reduce the noise on the bit line B1a/the complementary bit line B1b because the isolation control signal Iso is at the second voltage value, but the signal on the readout bit line saB1a/the complementary readout bit line saB1b inside the amplification circuit 23 may quickly reach the high reference potential/the low reference potential.

After the first amplifying stage ends, the amplification circuit 23 enters the second amplifying stage; at this point, the preset power signal VisoInt is maintained at the first voltage value, and the isolation control signal Iso is maintained at the first voltage value, which increases the turn-on degree of the ninth switch tube 309 and the tenth switch tube 310, thus completing the signal amplification of the signal to be processed (the signal of the bit line B1a)/the reference signal to be processed (the signal of the complementary bit line B1b). The amplified signal is output through a subsequent module to obtain the target amplification signal and complete the read instruction. In this stage, the voltage drop or rise of the bit line B1a will also rewrite data to the target memory cell to avoid data failure caused by the read instruction. As illustrated in FIG. 11, before the second amplifying stage ends, the first reference control signal/the second reference control signal SapEn is restored to the first level state.

After the second amplifying stage ends, the amplification circuit 23 enters the pre-charging stage, and the pre-charging signal Eq and the noise cancelling signal Nc are adjusted to the second level state; at this point, the first reference signal NCS/the second reference signal PCS is restored to the fourth voltage value, and the bit line B1a/the complementary bit line B1b and the readout bit line saB1a/the complementary readout bit line saB1b are restored to the same voltage value.

After the pre-charging stage ends, the amplification circuit 23 enters the standby stage again to prepare for the next operation.

In this way, the amplification control circuit 20 provided by the embodiments of the present disclosure has the following advantages. First, in the standby stage, the isolation control signal is a lower voltage value (the second voltage value) in the second level state, which can avoid the problem of electric leakage of the switch tube, reduce the phenomenon of component failure, and prolong the service life of a semiconductor memory; second, when the amplification circuit enters the noise cancelling stage from the standby stage, the isolation control signal needs to be adjusted from the second level state to the first level state, since the isolation control signal of the embodiments of the present disclosure has a lower voltage value in the standby stage, the level state is adjusted quickly, which can improve a signal processing speed; third, after the amplification circuit enters the second charge sharing stage, since the isolation control signal is a lower voltage value (the second voltage value) in the second level state, the noise during the voltage rise of the signal to be processed can be reduced, and an amplification margin can be improved; fourth, a discharge rate of the first reference signal may be adjusted by controlling the state of three eleventh switch tubes, thereby reducing the noise during the voltage drop of the signal to be processed.

In another specific embodiment, responsive to that the preset instruction is the read instruction, another method for amplification control may also be used.

If the amplification circuit is in the noise cancelling stage or the first charge sharing stage, the isolation control signal is maintained with the third voltage value; or if the amplification circuit is in the second charge sharing stage or the first amplifying stage, the isolation control signal is maintained with the first voltage value; or if the amplification circuit is in the standby stage or the pre-charging stage or the second amplifying stage, the isolation control signal is maintained with the second voltage value.

Figure 12:
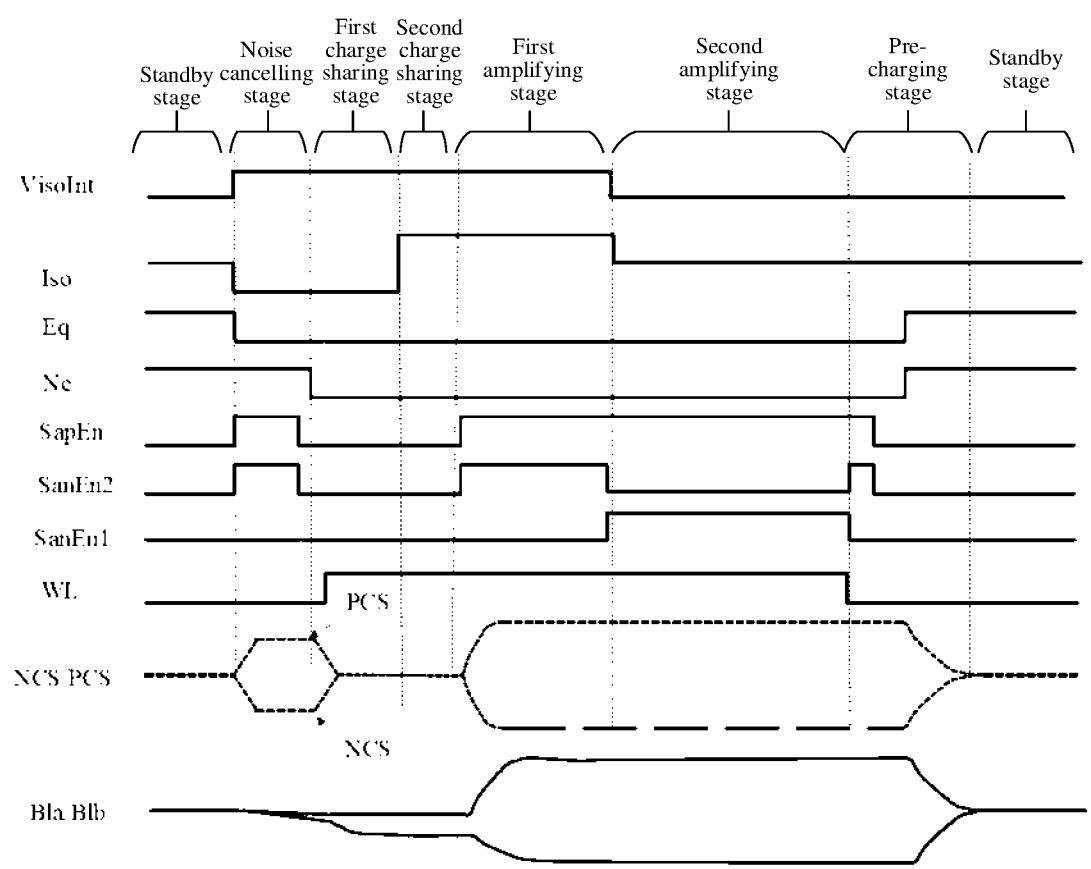
FIG. 12 is a second schematic diagram of a signal timing sequence provided by an embodiment of the present disclosure.

It is to be noted that FIG. 12 illustrates a schematic diagram of a signal timing sequence of another read operation provided by an embodiment of the present disclosure. The pre-charging signal Eq, the noise cancelling signal Nc, the second reference control signal SapEn, the first reference signal NCS, the second reference signal PCS, the bit line B1a, the complementary bit line B1b, the readout bit line saB1a and the complementary readout bit line saB1b in each stage of the amplification process are all the same as that of the amplification process in FIG. 11. In addition, the first reference control signal SanEn1 is used for controlling a part of the eleventh switch tubes on or off, the second reference control signal SanEn2 is used for controlling the other part of the eleventh switch tubes on or off, thereby reducing the power consumption.

In the embodiments of the present disclosure, in the second charge sharing stage or the first amplifying stage, it is necessary to maintain the isolation control signal with the first voltage value and improve the turn-on rate of the ninth switch tube 309 and the tenth switch tube 310, which can improve the signal transmission speed between the bit line B1a and the readout bit line saB1a, accelerate the amplification and rewriting process of the signal to be processed, save the signal amplification time, and reduce the time of the ninth switch tube 309 and the tenth switch tube 310 in a high voltage state to prolong the service life. In addition, the isolation power value changes to the first voltage value in advance in the noise cancelling stage, which can reduce the time required for voltage rise of the isolation control signal.

Both the above two methods for amplification control for the read operation may be used and selected according to the actual application scenarios.

In another specific embodiment, the preset instruction is the refresh instruction. The operation that the amplification circuit processes the signal to be processed includes: the standby stage, the noise cancelling stage, the first charge sharing stage, the second charge sharing stage, the first amplifying stage, the second amplifying stage and the pre-charging stage. The method may also include the following operation.

If the amplification circuit is in the noise cancelling stage or the first charge sharing stage, the isolation control signal is maintained with the third voltage value; or if the amplification circuit is in the standby stage or the second amplifying stage or the pre-charging stage, the isolation control signal is maintained with the second voltage value; or if the amplification circuit is in the second charge sharing stage or the first amplifying stage, the isolation control signal is maintained with the first voltage value.

In some embodiments, when the amplification circuit is in the noise cancelling stage, the isolation power value is maintained as a first power value.

Figure 13:
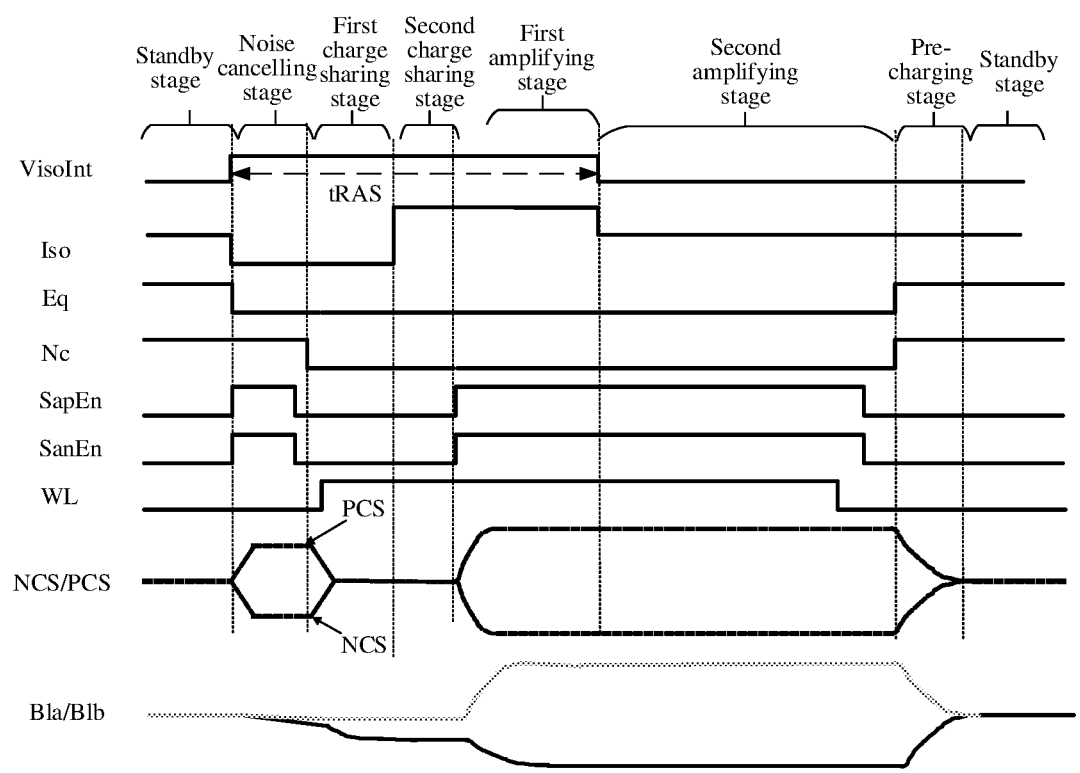
FIG. 13 is a third schematic diagram of a signal timing sequence provided by an embodiment of the present disclosure.

It is to be noted that FIG. 13 illustrates a schematic diagram of a signal timing sequence of a refresh operation provided by an embodiment of the present disclosure. The state of each signal in FIG. 13 may be understood by referring to FIG. 11. In particular, the change rules of the pre-charging signal Eq, the noise cancelling signal Nc, the first reference control signal SanEn, the second reference control signal SapEn, the word line enabling signal WL, the first reference signal NCS and the second reference signal PCS in FIG. 13 are the same as that in FIG. 11. The changes of only the isolation power value VisoInt and the isolation control signal Iso in different working stages are described below.

In the standby stage, FIG. 13 is the same as FIG. 11, that is, the isolation power supply value VisoInt is also the second voltage value, and the isolation control signal Iso is also the second voltage value.

In the noise cancelling stage, the isolation control signal Iso is also reduced from the second voltage value to the third voltage value. However, the isolation power value VisoInt is adjusted to the first voltage value in advance, so as to improve the speed at which the isolation control signal Iso changes from the third voltage value to the first voltage value, and accelerate signal transmission.

In the first charge sharing stage, the isolation control signal Iso is still maintained at the first voltage value, and the isolation power value VisoInt is still maintained at the first voltage value, that is, the bit line B1a and the readout bit line saB1a are controlled to be disconnected, and the complementary bit line B1b and the complementary readout bit line saB1b are controlled to be disconnected.

In the second charge sharing stage, the isolation power value VisoInt is maintained at the first voltage value, and the isolation control signal Iso is directly increased from the third voltage value to the first voltage value. The reason is that the isolation power value is usually generated far from the amplification circuit, and by switching the isolation power value VisoInt to the first voltage value in advance, not only the isolation power value can match an operation instruction signal, but also the transmission time of the first voltage value can be reduced to improve the turn-on rate of the ninth switch tube 309 and the tenth switch tube 310.

In the first amplifying stage, the isolation power value VisoInt is still maintained at the first voltage value, and the isolation control signal Iso is still maintained at the first voltage value. The reason is that the turn-on degree of the ninth switch tube 309 and the tenth switch tube 310 increases under the action of the first voltage value, the voltage change of the readout bit line saB1a is rapidly transferred to the bit line B1a, and the voltage change of the bit line B1a is also transferred to the first memory cell 51, so that the signal to be processed is rapidly amplified and rewritten, and the time of the ninth switch tube 309 and the tenth switch tube 310 under the high voltage is shortened, thus prolonging the service life of the ninth switch tube 309 and the tenth switch tube 310.

In the second amplifying stage, the isolation power value VisoInt is adjusted to the second voltage value, and the isolation control signal Iso is adjusted to the second voltage value. The reason is that, in the first amplifying stage, the voltage of the bit line B1a will reach 80-90% of the final voltage value, and the amplification of the signal to be processed is basically completed, at this point, the isolation control signal Iso is adjusted to the second voltage value, which can continue to change the voltage of the bit line B1a to the final voltage value, and reduce the consumption of the ninth switch tube 309 and the tenth switch tube 310, thus shortening the signal amplification time.

In the pre-charging stage, the pre-charging signal Eq and the noise cancelling signal Nc are adjusted to the second level state, so as to pre-charge each circuit node.

In this way, as illustrated in FIG. 13, for the refresh instruction, by increasing the isolation power value to the first voltage value in a period of time illustrated by tRAS, the voltage rise process of the isolation control signal may be accelerated, and the charge transmission speed in the second charge sharing stage and the first amplifying stage may be improved to improve the signal transmission speed.

The amplification control circuit 20 provided by the embodiments of the present disclosure has at least the following advantages. On the one hand, in the standby stage, the isolation control signal is a lower voltage value (the second voltage value) in the second level state, which can avoid the problem of electric leakage of the switch tube, reduce the phenomenon of component failure, and prolong the service life of the semiconductor memory; on the other hand, when the amplification circuit enters the noise cancelling stage from the standby stage, the isolation control signal needs to be adjusted from the second level state to the first level state, since the isolation control signal of the embodiments of the present disclosure has a lower voltage value in the standby stage, the level state is adjusted quickly, which can improve the signal processing speed.

In another specific embodiment, the preset instruction is the write instruction. The process that the amplification circuit processes the signal to be processed includes: the standby stage, the noise cancelling stage, the charge sharing stages (the first charge sharing stage and the second charge sharing stage), the first amplifying stage, the signal writing-in stage, the second amplifying stage and the pre-charging stage. The method may also include the following operation.

If the amplification circuit is in the noise cancelling stage or the charge sharing stage or the first amplifying stage, the isolation control signal is maintained with the third voltage value.

Alternatively, if the amplification circuit is in the standby stage or the second amplifying stage or the pre-charging stage, the isolation control signal is maintained with the second voltage value.

Alternatively, if the amplification circuit is in the signal writing-in stage, the isolation control signal is maintained with the first voltage value.

Figure 14:
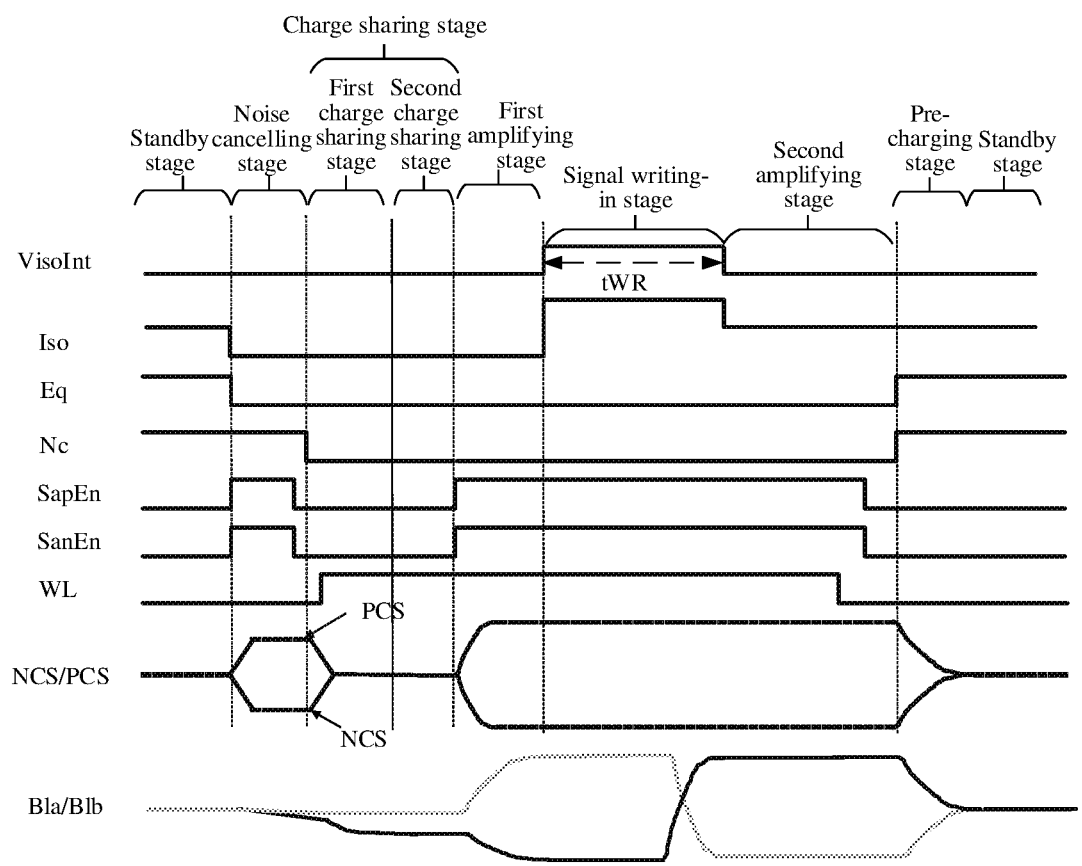
FIG. 14 is a fourth schematic diagram of a signal timing sequence provided by an embodiment of the present disclosure.

It is to be noted that FIG. 14 illustrates a schematic diagram of a signal timing sequence of a refresh operation provided by an embodiment of the present disclosure, which is described based on that the stored data is "0" and the written data is "1". The state of each signal in FIG. 14 may be understood by referring to FIG. 11.

In particular, the change rules of the pre-charging signal Eq, the noise cancelling signal Nc, the first reference control signal SanEn, the second reference control signal SapEn, the word line enabling signal WL, the first reference signal NCS and the second reference signal PCS in FIG. 14 are the same as that in FIG. 11. The changes of only the isolation power value VisoInt and the isolation control signal Iso in different working stages are described below.

In the standby stage, the noise cancelling stage and the first charge sharing stage, the change rules of the isolation power value VisoInt and the isolation control signal Iso in FIG. 14 and FIG. 11 are the same, and elaborations are omitted herein.

In the second charge sharing stage and the first amplifying stage, the isolation control signal Iso will not increase from the third voltage value, but continues maintaining the third voltage value. The reason is that after being enabled, the first memory cell 51 is enabled to be connected to the bit line B1a and form the signal to be processed, since the signal to be processed is formed by the memory cell, and the write instruction needs to transmit a new write signal to the memory cell, in the second charge sharing stage, the write signal has not been transmitted to the bit line B1a, and the amplification circuit can only process the signal to be processed formed by the memory cell without need of processing the signal quickly; however, the voltage of the complementary bit line B1b, which is higher than that of the bit line B1a, will turn on the sixth switch tube 306, the second reference signal PCS gradually increases the voltage of the readout bit line saB1a to turn on part of the sixth switch tube 306, and the first reference signal NCS gradually decreases the voltage of the complementary readout bit line saB1b, and then the off-state of the ninth switch tube 309 and the tenth switch tube 310 is affected, the voltage of the bit line B1a slowly decreases, and the voltage of the complementary bit line B1b will slowly increases. That the isolation control signal Iso is maintained at the third voltage value can extterminal the turn-off time of the amplification circuit and reduce the consumption of the amplification circuit.

In the signal writing-in stage, the isolation control signal increases from the third voltage value to the first voltage value. At this point, a written high voltage signal is transmitted to the bit line B1a, and then the voltage of the bit line B1a increases rapidly under the action of the written signal, the fifth switch tube 305 turns on quickly, the first reference signal NCS decreases the voltage of the complementary readout bit line saB1b to turn on the eighth switch tube 308, and the second reference signal PCS increases the voltage of the readout bit line saB1a. In this case, the ninth switch tube 309 and the tenth switch tube 310 with large turn-on degree can further accelerate the voltage change of the bit line B1a, so that the voltage quickly reaches the maximum voltage value. The voltage change of the bit line B1a will cause the voltage of the connected memory cells to change rapidly, and the stored data changes from 0 to 1. That the isolation control signal increases from the third voltage value to the first voltage value can improve the signal writing speed and ensure the data writing quality.

In the second amplifying stage, the isolation control signal decreases from the first voltage value to the second voltage value. The reason is that, since signal writing is basically completed in the previous stage, setting the isolation control signal to the second voltage value can continue maintaining the voltage of the write signal, ensure the completion of the write instruction, and reduce the power consumption of the ninth switch tube 309 and the tenth switch tube 310.

In the pre-charging stage, the pre-charging signal Eq and the noise cancelling signal Nc are adjusted to the second level state, so as to pre-charge each circuit node.

In this way, as illustrated in FIG. 14, for the write instruction, responsive to that a data writing operation is followed by a pre-charging operation, since the isolation power value switches from the second voltage value to the first voltage value in the tWR time, a quick writing operation is implemented, and the isolation power value is at the second voltage value in other time to achieve power saving.

It is to be noted that the embodiments of the present disclosure protect the change rules of the isolation control signal in the timing sequence, and the working stages of the amplification circuit are only an auxiliary descriptions, so the working stages of the amplification circuit have no additional qualification in the embodiments of the present disclosure. In fact, the working stages of the amplification circuit may be named and distinguished in a variety of manners.

In addition, for the amplification circuit without a noise cancellation function illustrated in FIG. 8, it may not have the noise cancelling stage, so, in some embodiments, for the read instruction, the working stages of the amplification circuit may include the standby stage, the first charge sharing stage, the second charge sharing stage, the first amplifying stage, the second amplifying stage and the pre-charging stage. That the amplification circuit receives the isolation control signal and the signal to be processed according to the preset instruction may include the following operation.

If the amplification circuit is in the standby stage or the second charge sharing stage, the isolation control signal is maintained with the third voltage value; or, if the amplification circuit is in the signal processing state or the pre-charging stage, the isolation control signal is maintained with the second voltage value; or, if the amplification circuit is in the first charge sharing stage, the isolation control signal is maintained with the first voltage value.

In some other embodiments, for the refresh instruction, the working stages of the amplification circuit may include the standby stage, the first charge sharing stage, the second charge sharing stage, the first amplifying stage, the second amplifying stage and the pre-charging stage. That the amplification circuit receives the isolation control signal and the signal to be processed according to the preset instruction may include the following operation.

If the amplification circuit is in the first charge sharing stage, the isolation control signal is maintained with the third voltage value; or if the amplification circuit is in the standby stage or the second amplifying stage or the pre-charging stage, the isolation control signal is maintained with the second voltage value; or if the amplification circuit is in the second charge sharing stage or the first amplifying stage, the isolation control signal is maintained with the first voltage value.

In some other embodiments, for the write instruction, the working stages of the amplification circuit may include the standby stage, the charge sharing stage, the first amplifying stage, the signal writing-in stage, the second amplifying stage and the pre-charging stage. That the amplification circuit receives the isolation control signal and the signal to be processed according to the preset instruction may include the following operation.

If the amplification circuit is in the charge sharing stage or the first amplifying stage, the isolation control signal is maintained with the third voltage value; or if the amplification circuit is in the standby stage or the second amplifying stage or the pre-charging stage, the isolation control signal is maintained with the second voltage value; or if the amplification circuit is in the signal writing-in stage, the isolation control signal is maintained with the first voltage value.

In this way, in the process of completing the preset operation, the isolation power value has at least three voltage values and switches among the three voltage values according to the specific working stage of the amplification circuit, which can optimize the signal amplification process and partially improve the problems of low signal amplification speed and large circuit noise.

In particular, each of the above stages and the change rules of the signal may be understood by referring to the aforementioned embodiments.

The embodiments of the present disclosure provide an amplification control method, which may include the following operations. The preset instruction is received, and the isolation power value and the control instruction signal are determined according to the preset instruction. The isolation control signal is generated according to the isolation power value and the control instruction signal. The amplification circuit receives the isolation control signal and the target signal to be processed according to the preset instruction, and processes the signal to be processed to complete the preset instruction. In this way, by controlling the specific voltage value of the isolation control signal through the isolation power value, the signal amplification process can be optimized, and the problems of low signal amplification speed and large circuit noise can be at least partially improved.

Figure 15:
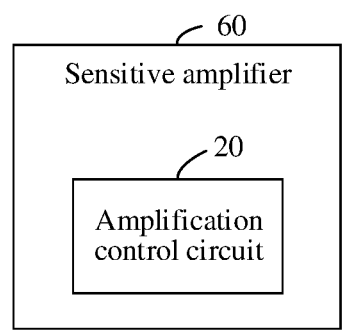
FIG. 15 is a schematic diagram of a composition structure of a sensitive amplifier provided by an embodiment of the present disclosure.

In another embodiment of the present disclosure, FIG. 15 illustrates a composition structure diagram of a sensitive amplifier 60 provided by an embodiment of the present disclosure. As illustrated in FIG. 15, the sensitive amplifier 60 may include the amplification control circuit 20 described in any above embodiment.

In this way, because the sensitive amplifier 60 may include the amplification control circuit 20 described in any above embodiment, the isolation power value can be controlled by using the power switching signal, and the specific voltage value of the isolation power value can be adjusted by changing the power switching signal, thereby improving the problems of low signal amplification and large circuit noise.

Figure 16:
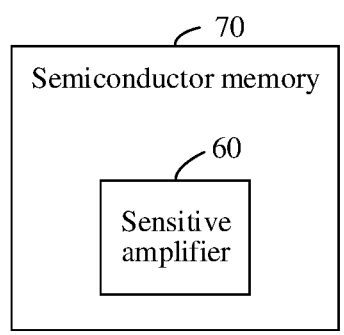
FIG. 16 is a schematic diagram of a composition structure of a semiconductor memory provided by an embodiment of the present disclosure.

In yet another embodiment of the present disclosure, FIG. 16 illustrates a composition structure diagram of a semiconductor memory 70 provided by an embodiment of the present disclosure. As illustrated in FIG. 16, the semiconductor memory 70 may include the sensitive amplifier 60 described in any above embodiment.

In the embodiments of the present disclosure, the semiconductor memory 70 may be a DRAM chip.

In this way, because the semiconductor memory 70 may include the aforementioned sensitive amplifier 60, the isolation power value can be controlled by using the power switching signal, and the specific voltage value of the isolation power value can be adjusted by changing the power switching signal, thereby improving the problems of low signal amplification and large circuit noise.

The above is only the preferred embodiments of the present disclosure and not intended to limit the protection scope of the present disclosure.

It is to be noted that terms "include" and "contain" or any other variant in the present disclosure is intended to cover nonexclusive inclusions herein, so that a process, method, object or device including a series of components not only includes those components but also includes other components which are not clearly listed or further includes components intrinsic to the process, the method, the object or the device. Under the condition of no more limitations, a component defined by the statement "including a/an" does not exclude existence of the same other components in a process, method, object or device including the component.

The sequence numbers of the embodiments of the present disclosure are adopted not to represent superiority-inferiority of the embodiments but only for description.

The methods disclosed in some method embodiments provided in the present disclosure may be freely combined without conflicts to obtain new method embodiments.

The characteristics disclosed in some product embodiments provided in the present disclosure may be freely combined without conflicts to obtain new product embodiments.

The characteristics disclosed in some method or device embodiments provided in the present disclosure may be freely combined without conflicts to obtain new method embodiments or device embodiments.

The above is only the specific implementation modes of the present disclosure and not intended to limit the protection scope of the present disclosure; any change or replacement that those skilled in the art can think of easily in the scope of technologies disclosed by the present disclosure shall fall within the protection scope of the present disclosure. Therefore, the scope of protection of the present disclosure shall be subject to the scope of protection of the claims.

INDUSTRIAL APPLICABILITY

The embodiments of the present disclosure provide an amplification control method and circuit, a sensitive amplifier and a semiconductor memory. The method includes that: a preset instruction is received, and an isolation power value and a control instruction signal are determined according to the preset instruction; an isolation control signal is generated according to the isolation power value and the control instruction signal; and an amplification circuit receives the isolation control signal and a target signal to be processed according to the preset instruction, and processes the signal to be processed to complete the preset instruction. In this way, by controlling the specific voltage value of the isolation control signal through the isolation power value, the signal amplification process can be optimized, and the problems of low signal amplification speed and large circuit noise can be at least partially improved.

The invention claimed is:

1. An amplification control method, applied to an amplification circuit, comprising:
   receiving a preset instruction, and determining an isolation power value and a control instruction signal according to the preset instruction;
   generating an isolation control signal according to the isolation power value and the control instruction signal; and
   receiving, by the amplification circuit, the isolation control signal and a target signal to be processed according to the preset instruction, processing the signal to be processed, and completing the preset instruction.

2. The amplification control method of claim 1, wherein the preset instruction at least comprises one of a read instruction, a refresh instruction and a write instruction;
   the isolation power value is a second voltage value or a third voltage value;
   the isolation control signal is one of a first voltage value, the second voltage value and the third voltage value;
   the first voltage value is greater than the second voltage value, and the second voltage value is greater than the third voltage value.

3. The amplification control method of claim 2, wherein determining the isolation power value according to the preset instruction comprises:
   obtaining at least one of a first power switching signal or a second power switching signal according to the preset instruction; and
   determining the isolation power value according to the at least one of the first power switching signal or the second power switching signal;
   wherein determining the isolation power value according to the at least one of the first power switching signal or the second power switching signal comprises:
   determining that the isolation power value has the first voltage value responsive to that the first power switching signal has a first level state and the second power switching signal has a second level state; or
   determining that the isolation power value has the second voltage value responsive to that the first power switching signal has the second level state and the second power switching signal has the first level state;
   wherein both the first voltage value and the second voltage value belong to the second level state.

4. The amplification control method of claim 2, wherein generating the isolation control signal according to the isolation power value and the control instruction signal comprises:
   determining that the isolation control signal has the first voltage value responsive to that the control instruction signal has a second state and the isolation power value has the first voltage value; or
   determining that the isolation control signal has the second voltage value responsive to that the control instruction signal has the second state and the isolation power value has the second voltage value; or
   determining that the isolation control signal has the third voltage value responsive to that the control instruction signal has a first state;
   wherein the first state is a first level state or a second level state, the second state is the first level state or the second level state, and a level state of the first state and a level state of the second state are different; the third voltage value belongs to the first level state.

5. The amplification control method of claim 2, wherein processing, by the amplification circuit, the signal to be processed comprises: a signal amplifying stage, in which the signal to be processed is amplified by the amplification circuit and then is written into a memory cell;
   when the amplification circuit is in one stage of the signal amplifying stage, the isolation control signal is controlled to have the first voltage value;
   when the preset instruction is the read instruction or the refresh instruction, the signal amplifying stage comprises a first amplifying stage and a second amplifying stage;
   when the preset instruction is the write instruction, the signal amplifying stage comprises the first amplifying stage, a signal writing-in stage and the second amplifying stage.

6. The amplification control method of claim 2, wherein responsive to that the preset instruction is the read instruction, processing, by the amplification circuit, the signal to be processed comprises: a standby stage, a noise cancelling stage, a first charge sharing stage, a second charge sharing stage, a first amplifying stage, a second amplifying stage and a pre-charging stage; the method further comprises:
   when the amplification circuit is in the noise cancelling stage or the first charge sharing stage, maintaining the isolation control signal with the third voltage value; or
   when the amplification circuit is in the standby stage or the second charge sharing stage or the first amplifying stage, maintaining the isolation control signal with the second voltage value; or
   when the amplification circuit is in the pre-charging stage or the second amplifying stage, maintaining the isolation control signal with the first voltage value.

7. The amplification control method of claim 2, wherein responsive to that the preset instruction is the read instruction, processing, by the amplification circuit, the signal to be processed comprises: a standby stage, a noise cancelling stage, a first charge sharing stage, a second charge sharing stage, a first amplifying stage, a second amplifying stage and a pre-charging stage; the method further comprises:
   when the amplification circuit is in the noise cancelling stage or the first charge sharing stage, maintaining the isolation control signal with the third voltage value; or when the amplification circuit is in the second charge sharing stage or the first amplifying stage, maintaining the isolation control signal with the first voltage value; or when the amplification circuit is in the standby stage or the pre-charging stage or the second amplifying stage, maintaining the isolation control signal with the second voltage value.

8. The amplification control method of claim 2, wherein responsive to that the preset instruction is the refresh instruction, processing, by the amplification circuit, the signal to be processed comprises: a standby stage, a noise cancelling stage, a first charge sharing stage, a second charge sharing stage, a first amplifying stage, a second amplifying stage and a pre-charging stage; the method further comprises:

when the amplification circuit is in the noise cancelling stage or the first charge sharing stage, maintaining the isolation control signal with the third voltage value; or when the amplification circuit is in the standby stage or the second amplifying stage or the pre-charging stage, determining that the isolation control signal has the second voltage value; or when the amplification circuit is in the second charge sharing stage or the first amplifying stage, maintaining the isolation control signal with the first voltage value.

9. The amplification control method of claim 2, wherein responsive to that the preset instruction is the write instruction, processing, by the amplification circuit, the signal to be processed comprises: a standby stage, a noise cancelling stage, a charge sharing stage, a first amplifying stage, a signal writing-in stage, a second amplifying stage and a pre-charging stage; the method further comprises:

when the amplification circuit is in the noise cancelling stage or the charge sharing stage or the first amplifying stage, maintaining the isolation control signal with the third voltage value; or when the amplification circuit is in the standby stage or the second amplifying stage or the pre-charging stage, maintaining the isolation control signal with the second voltage value;

or when the amplification circuit is in the signal writing-in stage, maintaining the isolation control signal with the first voltage value.

10. The amplification control method of claim 2, wherein responsive to that the preset instruction is the read instruction, a working state of the amplification circuit comprises: a standby stage, a first charge sharing stage, a second charge sharing stage, a first amplifying stage, a second amplifying stage and a pre-charging stage; the method further comprises:

when the amplification circuit is in the standby stage or the second charge sharing stage, maintaining the isolation control signal with the third voltage value; or when the amplification circuit is in a signal processing state or the pre-charging stage, maintaining the isolation control signal with the second voltage value; or when the amplification circuit is in the first charge sharing stage, maintaining the isolation control signal with the first voltage value.

11. The amplification control method of claim 2, wherein responsive to that the preset instruction is the refresh instruction, a working state of the amplification circuit comprises: a standby stage, a first charge sharing stage, a second charge sharing stage, a first amplifying stage, a second amplifying stage and a pre-charging stage; the method further comprises:

when the amplification circuit is in the first charge sharing stage, maintaining the isolation control signal with the third voltage value, when the amplification circuit is in the standby stage or the second amplifying stage or the pre-charging stage, maintaining the isolation control signal with the second voltage value; or when the amplification circuit is in the second charge sharing stage or the first amplifying stage, maintaining the isolation control signal with the first voltage value.

12. The amplification control method of claim 2, wherein responsive to that the preset instruction is the write instruction, processing, by the amplification circuit, the signal to be processed comprises: a standby stage, a charge sharing stage, a first amplifying stage, a signal writing-in stage, a second amplifying stage and a pre-charging stage;

when the amplification circuit is in the charge sharing stage or the first amplifying stage, maintaining the isolation control signal with the third voltage value; or when the amplification circuit is in the standby stage or the second amplifying stage or the pre-charging stage, maintaining the isolation control signal with the second voltage value; or when the amplification circuit is in the signal writing-in stage, maintaining the isolation control signal with the first voltage value.

13. The amplification control method of claim 6, further comprising:

when the amplification circuit is in the standby stage, maintaining each node voltage in the amplification circuit at a preset potential;

when the amplification circuit is in the first charge sharing stage, forming, by a target memory cell, the signal to be processed according to the preset instruction;

when the amplification circuit is in the second charge sharing stage, transmitting the signal to be processed to the amplification circuit in response to the isolation control signal;

when the amplification circuit is in the first amplifying stage, amplifying, by the amplification circuit, the signal to be processed;

when the amplification circuit is in the second amplifying stage, recovering data of the target memory cell through the amplified signal to be processed;

when the amplification circuit is in the pre-charging stage, completing, by the amplification circuit, the preset instruction for the target memory cell and recovering, by the amplification circuit, each node voltage in the amplification circuit to the preset potential;

wherein responsive to that the preset instruction is the write instruction, the amplification circuit is in a signal writing-in stage and receives a write signal; the write signal replaces the signal generated by the memory cell to form the signal to be processed, and the amplification circuit amplifies the signal to be processed.

14. An amplification control circuit, to which the amplification control method of claim 1 is applied, comprising: a signal determination circuit, an isolation control circuit and an amplification circuit; wherein the signal determination circuit is configured to determine, after receiving a preset instruction, an isolation power value and a control instruction signal according to the preset instruction;

the isolation control circuit is configured to receive the isolation power value and the control instruction signal, and generate an isolation control signal according to the control instruction signal;

the amplification circuit is configured to receive the isolation control signal and a target signal to be processed according to the preset instruction, and process the signal to be processed and complete the preset instruction.

15. The amplification control circuit of claim 14, wherein the isolation power value and the control instruction signal are determined through the signal determination circuit, and the isolation control signal is determined through the isolation control circuit;
the signal determination circuit comprises a first signal determination circuit, a power output circuit and a second signal determination circuit; wherein
the first signal determination circuit is configured to output, after receiving the preset instruction, at least one of a first power switching signal or a second power switching signal according to the preset instruction;
the power output circuit is configured to output the isolation power value according to the at least one of the first power switching signal or the second power switching signal;
the second signal determination circuit is configured to generate the control instruction signal according to the preset instruction;
the preset instruction at least comprises one of a read instruction, a refresh instruction and a write instruction.

16. The amplification control circuit of claim 15, wherein the power output circuit is configured to: determine that the isolation power value has a first voltage value responsive to that the first power switching signal has a first level state and the second power switching signal has a second level state; or
determine that the isolation power value has a second voltage value responsive to that the first power switching signal has the second level state and the second power switching signal has the first level state;
wherein both the first voltage value and the second voltage value belong to the second level state, and the first voltage value is greater than the second voltage value;
wherein the isolation control circuit is specifically configured to: determine that the isolation control signal has the first voltage value responsive to that the control instruction signal has a second state and the isolation power value has the first voltage value; or
determine that the isolation control signal has the second voltage value responsive to that the control instruction signal has the second state and the isolation power value has the second voltage value; or
determine that the isolation control signal has a third voltage value responsive to that the control instruction signal has a first state;
wherein the first state is the first level state or the second level state, the second state is the first level state or the second level state, and a level state of the first state and a level state of the second state are different; the third voltage value belongs to the first level state, and the third voltage value is less than the second voltage value.

17. The amplification control circuit of claim 16, wherein the power output circuit comprises a first preset power supply, a second preset power supply, a first switch tube and a second switch tube; wherein
a first terminal of the first switch tube is connected to the first power switching signal, and a first terminal of the second switch tube is connected to the second power switching signal;
a second terminal of the first switch tube is connected to the first preset power supply, and a second terminal of the second switch tube is connected to the second preset power supply;
a third terminal of the first switch tube is connected to a third terminal of the second switch tube to output the isolation power value;
wherein the first preset power supply is configured to output the first voltage value, and the second preset power supply is configured to output the second voltage value;
the isolation control circuit comprises a first inverter, a third switch tube and a fourth switch tube; wherein
an input terminal of the first inverter is connected to the control instruction signal, and an output terminal of the first inverter is connected to a first terminal of the third switch tube and a first terminal of the fourth switch tube respectively;
a second terminal of the third switch tube is connected to the isolation power value, and a third terminal of the fourth switch tube is connected to a ground signal;
a third terminal of the third switch tube is connected to a second terminal of the fourth switch tube to output the isolation control signal;
wherein the amplification circuit comprises a control circuit and a cross-coupling circuit; the cross-coupling circuit comprises a fifth switch tube, a sixth switch tube, a seventh switch tube and an eighth switch tube; the control circuit comprises a ninth switch tube and a tenth switch tube;
a first terminal of the fifth switch tube is connected to a third terminal of the ninth switch tube to receive the signal to be processed; a second terminal of the fifth switch tube, a third terminal of the seventh switch tube and a first terminal of the eighth switch tube are connected to a second terminal of the tenth switch tube;
a first terminal of the sixth switch tube is connected to a third terminal of the tenth switch tube to receive a reference signal to be processed; a second terminal of the sixth switch tube, a third terminal of the eighth switch tube and a first terminal of the seventh switch tube are connected to a second terminal of the ninth switch tube;
a third terminal of the fifth switch tube and a third terminal of the sixth switch tube are connected to a first reference signal; a second terminal of the seventh switch tube and a second terminal of the eighth switch tube are connected to a second reference signal; and a first terminal of the ninth switch tube and a first terminal of the tenth switch tube are connected to the isolation control signal.

18. The amplification control circuit of claim 17, wherein the amplification circuit further comprises a pre-charging circuit, and the pre-charging circuit comprises a thirteenth switch tube and a fourteenth switch tube; wherein
a first terminal of the thirteenth switch tube and a first terminal of the fourteenth switch tube are connected to a pre-charging control signal;
a second terminal of the thirteenth switch tube is connected to a fourth preset power supply, and a third terminal of the thirteenth switch tube is connected to the second terminal of the sixth switch tube;
a third terminal of the fourteenth switch tube is connected to the second terminal of the fifth switch tube, and a second terminal of the fourteenth switch tube is connected to the second terminal of the sixth switch tube;

the amplification circuit further comprises a noise cancelling circuit; the noise cancelling circuit comprises a fifteenth switch tube and a sixteenth switch tube; wherein
a first terminal of the fifteenth switch tube and a first terminal of the sixteenth switch tube are connected to a noise control signal;
a second terminal of the fifteenth switch tube is connected to the second terminal of the fifth switch tube, and a third terminal of the fifteenth switch tube is connected to the first terminal of the fifth switch tube;
a second terminal of the sixteenth switch tube is connected to the second terminal of the sixth switch tube, and a third terminal of the sixteenth switch tube is connected to the first terminal of the sixth switch tube;
wherein the first switch tube, the second switch tube, the third switch tube, the seventh switch tube and the eighth switch tube are P-type Field Effect Transistors (FETs);
the fourth switch tube, the fifth switch tube, the sixth switch tube, the ninth switch tube, the tenth switch tube, the thirteenth switch tube, the fourteenth switch tube, the fifteenth switch tube and the sixteenth switch tube are N-type FETs;
wherein a first terminal of the P-type FET is a gate electrode terminal, a second terminal of the P-type FET is a source electrode terminal, and a third terminal of the P-type FET is a drain electrode terminal; a first terminal of the N-type FET is the gate electrode terminal, a second terminal of the N-type FET is the drain electrode terminal, and a third terminal of the N-type FET is the source electrode terminal.

19. A sensitive amplifier, comprising the amplification control circuit of claim 14.

20. A semiconductor memory, comprising the sensitive amplifier of claim 19.

* * * * *